(12) United States Patent
Khorashadi et al.

(10) Patent No.: US 9,116,003 B2
(45) Date of Patent: Aug. 25, 2015

(54) ROUTING GRAPHS FOR BUILDINGS

(75) Inventors: Behrooz Khorashadi, San Jose, CA (US); Saumitra Mohan Das, San Jose, CA (US); Rajarshi Gupta, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 104 days.

(21) Appl. No.: 12/875,756

(22) Filed: Sep. 3, 2010

(65) Prior Publication Data
US 2011/0082638 A1   Apr. 7, 2011

Related U.S. Application Data

(60) Provisional application No. 61/247,866, filed on Oct. 1, 2009, provisional application No. 61/247,865, filed on Oct. 1, 2009, provisional application No. 61/247,869, filed on Oct. 1, 2009, provisional application No. 61/297,524, filed on Jan. 22, 2010.

(51) Int. Cl.
*G01C 21/20* (2006.01)
*G06F 17/50* (2006.01)

(52) U.S. Cl.
CPC .............. *G01C 21/20* (2013.01); *G01C 21/206* (2013.01); *G06F 17/5004* (2013.01); *G06F 17/509* (2013.01)

(58) Field of Classification Search
CPC ...... G01C 21/20; G01C 21/206; G01C 21/32; G01C 21/34; G06F 17/5004; G06F 17/5077; G06F 17/509; G06F 17/50; G06F 2217/06; G09B 29/10; G09B 29/102; G09B 29/106; G05D 2201/0211

USPC ................. 701/400, 408–410, 420, 433–439, 701/450–469, 532–533, 537–541
See application file for complete search history.

(56) References Cited

U.S. PATENT DOCUMENTS

| 6,009,359 A | 12/1999 | El-Hakim et al. |
| 6,047,234 A | 4/2000 | Cherveny et al. |

(Continued)

FOREIGN PATENT DOCUMENTS

| CN | 1351741 A | 5/2002 |
| CN | 1530635 A | 9/2004 |

(Continued)

OTHER PUBLICATIONS

Xiang Li, Christophe Claramunt, Cyril Ray, "A Continuous-based Model for the Analysis of Indoor Spaces", Spatial and Temporal Reasoning for Ambient Intelligence Systems, COSIT 2009 Workshop Proceedings, Aug. 2009, Edited by Mehul Bhatt and Hans Guesgen, pp. 44-53).*

(Continued)

*Primary Examiner* — Khoi Tran
*Assistant Examiner* — Abby Lin

(57) ABSTRACT

The subject matter disclosed herein relates to systems, methods, etc. for creating a routing graph based at least partly on building information. For certain example implementations, a method includes obtaining building information descriptive of at least a portion of a building structure. A grid of points may be superimposed onto the building information. At least one routing graph may be created based at least in part on the superimposed grid of points and the building information. Other example implementations are also described.

25 Claims, 14 Drawing Sheets

(56) References Cited

U.S. PATENT DOCUMENTS

| | | |
|---|---|---|
| 6,259,405 B1 | 7/2001 | Stewart et al. |
| 6,262,738 B1 | 7/2001 | Gibson et al. |
| 6,295,502 B1 | 9/2001 | Hancock et al. |
| 6,366,242 B1 | 4/2002 | Boyd et al. |
| 6,490,460 B1 | 12/2002 | Soliman |
| 6,510,244 B2 | 1/2003 | Proesmans et al. |
| 6,529,164 B1 | 3/2003 | Carter |
| 6,597,359 B1 | 7/2003 | Lathrop |
| 6,859,727 B2 | 2/2005 | Bye et al. |
| 6,917,893 B2 | 7/2005 | Dietsch et al. |
| 7,035,650 B1 | 4/2006 | Moskowitz et al. |
| 7,379,958 B2 | 5/2008 | Karhu |
| 7,466,986 B2 | 12/2008 | Halcrow et al. |
| 7,480,513 B2 | 1/2009 | Woo |
| 7,616,156 B2 | 11/2009 | Smith et al. |
| 7,647,055 B2 | 1/2010 | Gum et al. |
| 7,761,233 B2 | 7/2010 | Schott et al. |
| 7,840,227 B2 | 11/2010 | Kahlert et al. |
| 7,899,006 B2 | 3/2011 | Boyd |
| 7,912,633 B1 | 3/2011 | Dietsch et al. |
| 8,040,219 B2 | 10/2011 | Haartsen et al. |
| 8,064,954 B1 | 11/2011 | Fujisaki |
| 8,068,056 B2 | 11/2011 | Wachter et al. |
| 8,102,314 B2 | 1/2012 | Bamberger et al. |
| 8,150,397 B2 | 4/2012 | Khetawat et al. |
| 8,234,234 B2 | 7/2012 | Shearer |
| 8,340,901 B2 | 12/2012 | Fahn et al. |
| 8,344,949 B2 | 1/2013 | Moshfeghi |
| 8,350,758 B1 | 1/2013 | Parvizi et al. |
| 8,818,401 B2 | 8/2014 | Gupta et al. |
| 2001/0037305 A1 | 11/2001 | Mochizuki |
| 2002/0059025 A1 | 5/2002 | Kim et al. |
| 2003/0008661 A1 | 1/2003 | Joyce et al. |
| 2004/0015325 A1 | 1/2004 | Hirano et al. |
| 2004/0061646 A1 | 4/2004 | Andrews et al. |
| 2004/0117753 A1* | 6/2004 | Kahng et al. ............. 716/12 |
| 2004/0139049 A1 | 7/2004 | Hancock et al. |
| 2004/0181335 A1 | 9/2004 | Kim et al. |
| 2004/0193365 A1 | 9/2004 | Kokojima et al. |
| 2004/0193707 A1 | 9/2004 | Alam et al. |
| 2005/0280647 A1 | 12/2005 | Wang et al. |
| 2006/0149465 A1 | 7/2006 | Park et al. |
| 2006/0217881 A1 | 9/2006 | Pei et al. |
| 2006/0245406 A1 | 11/2006 | Shim |
| 2006/0287813 A1 | 12/2006 | Quigley |
| 2007/0052724 A1 | 3/2007 | Graham et al. |
| 2007/0143016 A1 | 6/2007 | Kung et al. |
| 2007/0184845 A1 | 8/2007 | Troncoso |
| 2007/0219711 A1 | 9/2007 | Kaldewey et al. |
| 2007/0293239 A1 | 12/2007 | Dawson et al. |
| 2008/0082225 A1 | 4/2008 | Barrett |
| 2008/0102857 A1 | 5/2008 | Kim |
| 2008/0183483 A1* | 7/2008 | Hart ............................. 705/1 |
| 2009/0019095 A1 | 1/2009 | Asahara et al. |
| 2009/0043502 A1 | 2/2009 | Shaffer et al. |
| 2009/0043504 A1* | 2/2009 | Bandyopadhyay et al. .. 701/213 |
| 2009/0102707 A1 | 4/2009 | Elwell, Jr. et al. |
| 2009/0119010 A1* | 5/2009 | Moravec ...................... 701/209 |
| 2009/0157294 A1 | 6/2009 | Geelen et al. |
| 2009/0163228 A1 | 6/2009 | Blumberg et al. |
| 2009/0216438 A1 | 8/2009 | Shafer |
| 2009/0238417 A1* | 9/2009 | Nielsen et al. ............... 382/113 |
| 2009/0251366 A1 | 10/2009 | McClure et al. |
| 2010/0008337 A1 | 1/2010 | Bajko |
| 2010/0023249 A1* | 1/2010 | Mays et al. .................. 701/200 |
| 2010/0023250 A1 | 1/2010 | Mays et al. |
| 2010/0023252 A1 | 1/2010 | Mays et al. |
| 2010/0125409 A1 | 5/2010 | Prehofer |
| 2010/0259450 A1 | 10/2010 | Kainulainen et al. |
| 2010/0299065 A1 | 11/2010 | Mays |
| 2010/0305851 A1 | 12/2010 | Meyer et al. |
| 2011/0015860 A1* | 1/2011 | Nesbitt ........................ 701/209 |
| 2011/0080848 A1* | 4/2011 | Khorashadi et al. ......... 370/254 |
| 2011/0081918 A1 | 4/2011 | Burdo et al. |
| 2011/0081919 A1 | 4/2011 | Das et al. |
| 2011/0086646 A1 | 4/2011 | Gupta et al. |
| 2011/0172916 A1 | 7/2011 | Pakzad et al. |
| 2011/0178705 A1 | 7/2011 | Pakzad et al. |
| 2012/0007779 A1 | 1/2012 | Klepal et al. |
| 2012/0029817 A1 | 2/2012 | Khorashadi et al. |
| 2012/0044265 A1* | 2/2012 | Khorashadi et al. ......... 345/641 |
| 2012/0101727 A1 | 4/2012 | Mays et al. |
| 2012/0130632 A1 | 5/2012 | Bandyopadhyay et al. |
| 2012/0203453 A1 | 8/2012 | Lundquist et al. |
| 2013/0316742 A1 | 11/2013 | Gupta et al. |
| 2013/0317778 A1 | 11/2013 | Gupta et al. |
| 2013/0345967 A1 | 12/2013 | Pakzad |
| 2014/0066103 A1 | 3/2014 | Das et al. |
| 2014/0095007 A1* | 4/2014 | Angle et al. ................... 701/23 |

FOREIGN PATENT DOCUMENTS

| | | |
|---|---|---|
| CN | 1707223 A | 12/2005 |
| CN | 101147407 A | 3/2008 |
| CN | 101151508 A | 3/2008 |
| CN | 101275854 A | 10/2008 |
| CN | 101427105 A | 5/2009 |
| CN | 101487714 A | 7/2009 |
| CN | 101576384 A | 11/2009 |
| DE | 102007045082 A1 | 4/2009 |
| EA | 009927 B1 | 4/2008 |
| EP | 0921509 A2 | 6/1999 |
| EP | 1708152 A2 | 10/2006 |
| EP | 2148167 A2 | 1/2010 |
| GB | 2355793 A | 5/2001 |
| JP | H11249552 A | 9/1999 |
| JP | 2000111648 A | 4/2000 |
| JP | 2001285337 A | 10/2001 |
| JP | 2002221422 A | 8/2002 |
| JP | 2003240591 A | 8/2003 |
| JP | 2004150827 A | 5/2004 |
| JP | 2006130131 A | 5/2006 |
| JP | 2006267057 A | 10/2006 |
| JP | 2006267114 A | 10/2006 |
| JP | 2007333998 A | 12/2007 |
| JP | 2008083112 A | 4/2008 |
| JP | 2008219394 A | 9/2008 |
| JP | 2009123105 A | 6/2009 |
| JP | 2010539547 A | 12/2010 |
| KR | 20060078162 A | 7/2006 |
| KR | 20070056673 A | 6/2007 |
| KR | 20080092781 A | 10/2008 |
| KR | 20090096982 A | 9/2009 |
| RU | 2358282 C2 | 6/2009 |
| TW | I230909 B | 4/2005 |
| TW | I240085 B | 9/2005 |
| TW | 200821550 A | 5/2008 |
| WO | WO-2005027553 A1 | 3/2005 |
| WO | WO-2005106503 A1 | 11/2005 |
| WO | WO2005106523 A1 | 11/2005 |
| WO | WO-2007025143 A1 | 3/2007 |
| WO | WO-2007056738 A2 | 5/2007 |
| WO | WO-2009040063 A1 | 4/2009 |
| WO | WO2009056150 A1 | 5/2009 |

OTHER PUBLICATIONS

Emily Whiting, Geometric, Topological & Semantic Analysis of Multi-Building Floor Plan Data, Jun. 2006, Thesis for Master of Science in Architecture Studies at Massachusetts Institute of Technology.*

Holly Yanco, "Wheelesley: A Robotic Wheelchair System: Indoor Navigation and User Interface", Assistive Technology and AI, LNAO 1458, V.O. Mittal et al (Eds), 1998, pA 256-268.*

Sherwani, Lecture notes: Global Routing, Algorithms for VLSI Physical Design Automation, 1992.*

Xiang Li, XCihui Zhang, Lu Tan, "Assisting video surveillance in micro-spatial environments with a GIS approach", Geoinformatics 2007 Geospatial Information Technology and Applications, SPIE vol. 6754 (2007).*

Luca Chittaro and Daniele Nadalutti, "Presenting Evacuation Instructions on Mobile Devices by means of Location-Aware 3D

(56) References Cited

OTHER PUBLICATIONS

Virtual Environments", MobileHCI 2008, Sep. 2-5, 2008, Amsterdam, the Netherlands.*
Bernhard Lorenz et al, "A Hybrid Spatial Model for Representing Indoor Environments", W2GIS 2006, LNCS 4295 pp. 102-112.*
Whiting, "Geometric, Topological & Semantic Analysis of Multi-Building Floor Plan Data", Jun. 2006, Thesis for Master of Science in Architecture Studies at Massachusetts Institute of Technology.*
Li et al, "A Continuous-based Model for the Analysis of Indoor Spaces", Spatial and Temporal Reasoning for Ambient Intelligence Systems, COSIT 2009 Workshop Proceedings, Aug. 2009, Edited by Mehul Bhatt and Hans Guesgen, pp. 44-53.*
Beal J.R. Jr., et al., "Contextual Geolocation: A Specialized Application for Improving Indoor Location Awareness in Wireless Local Area Networks," College of Graduate Studies and Research, Minnesota State University, Mankato, MN, 2003, 17 pages.
Ceranka S. et al., "Application of particle filtering in navigation system for blind", ISSPA 2003, Seventh International Symposium on Signal Processing and Its Applications, Proceedings (Cat.No. 03EX714), vol. 2, 2003, pp. 495-498, XP002632287.
Chaer W.S., et al., "A mixture-of-experts framework for adaptive Kalman filtering", IEEE Transactions on Systems, Man and Cybernetics, Part B (Cybernetics), vol. 27, No. 3, Jun. 1997, pp. 452-464, XP002632376, IEEE USA ISSN: 1083-4419, DOI: 10.1109/3477.584952.
Evennou F., et al., "Map-aided indoor mobile positioning system using particlefilter", IEEE Wireless Communications and Networking Conference (IEEE Cat. No. 05TH8794), vol. 4, May 2, 2005, pp. 2490-2494, XP002632286, IEEE Piscataway, NJ, USA.
International Search Report and Written Opinion—PCT/US2010/051226—International Search Authority, European Patent Office, Feb. 1, 2011.
Kandepu R., et al., "Constrained state estimation using the Unscented Kalman Filter", Control and Automation, 2008 16th Mediterranean Conference on, IEEE, Piscataway, NJ, USA, Jun. 25, 2008, pp. 1453-1458, XP031308449, ISBN: 978-1-4244-2504-4.
Lyardet F., et al., "CoINS: Context Sensitive Indoor Navigation System", Multimedia, 2006. ISM'06. Eighth IEEE International Symposium on, IEEE, PI, Dec. 1, 2006, pp. 209-218, XP031041784, ISBN: 978-0-7695-2746-8 p. 1, right-hand column p. 2, right-hand column—p. 6, left-hand column.
Meneses F., et al., "Enhancing the Location-Context Through Inference Over Positioning Data", Department of Information Systems, University of Minho, Portugal, 2006, pp. 40-49.
Min K., et al., "The Mobile Spatial DBMS for the Partial Map Air Update in the Navigation", Proceedings of the 11th International IEEE Conference on Intelligent Transportation Systems, Oct. 12-15, 2008, pp. 476-481.
Nomoto K., et al., "An adaptive tracking filter controlling sampling frequency phased array radar", ICASSP 86 Proceedings. IEEE-IECEJ-ASJ International Conference on Acoustics, Speech and Signal Processing (Cat. No. 86CH2243-4), 1986, pp. 2571-2574, XP002632375, IEEE New York, NY, USA.
OMA (Open Mobile Alliance Ltd.), "Secure User Plan Location Architecture", Draft Version 3.0—Feb. 10, 2010, pp. 1-41.
Orville R.E., "Development of the National Lightning Detection Network," BAMS, Feb. 2008, 11 pages.
Paul A.S., et al., "Wi-Fi based indoor localization and tracking using sigma-point Kalman filtering methods", Position, Location and Navigation Symposium, 2008 IEEE/ ION, IEEE, Piscataway, NJ, USA, May 5, 2008, pp. 646-659, XP031288927, ISBN: 978-1-4244-1536-6.
Soltani A. R., et al., "A fuzzy based multi-objective path planning of construction sites", Automation in Construction, Elsevier Science Publishers, Amsterdam, NL, vol. 13, No. 6, Nov. 1, 2004, pp. 717-734, XP004543997, ISSN: 0926-5805, DOI: DOI:10.1016/J.AUTCON.2004.04.012 p. 719, left-hand column, paragraph 2 p. 720-p. 721 p. 723, right-hand column p. 725, right-hand column—p. 727 figures 1-3,5,7,10,14.
Zha H., et al., "Detecting changes in a dynamic environment for updating its maps by using a mobile robot", Intelligent Robots and Systems, 1997, IROS 97, Proceedings of the 19 97 IEEE/RSJ International Conference on Grenoble, France Sep. 7-11, 1997, New York, NY, USA, IEEE, US, vol. 3, Sep. 7, 1997, pp. 1729-1734, XP010264873, DOI: 10.1109/IROS.1997.656593, ISBN: 978-0-7803-4119-7.
Martire, et al., "Location based service architecture for simple mobile services", Information Society Technologies, Version 1.1, Aug. 2008.
Xiaoqin et al., "The Control of Navigation Along a Wall for a Mobile Robot Based on Infrared PSD," (Wall-following Navigation Control for Infra PSD-based Mobile Robot) Machine Tool & Hydraulics, Sep. 30, 2009, vol. 37, No. 9, pp. 133-136.
Butz A., et al., "A Hybrid Indoor Navigation System," International Conference on Intelligent User Interfaces, 2001, pp. 1-8.
Li X., et al., "A continuous-based model for the analysis of indoor spaces", Conference on Spatial Information Theory (COSIT 2009), Sep. 21, 2009, XP002690502, [retrieved on Jan. 11, 2013].
Nizetic, I., et al., "A prototype for the short-term prediction of moving object's movement using markov chains", proceedings of the ITI, Jun. 25, 2009, XP002690504, pp. 559-564, [retrieved on Jan. 16, 2013].
Widyawan et al: "A novel backtracking particle filter for pattern matching indoor localization", Proceedings of the First ACM International Workshop on Mobile Entity Localization and Tracking in GPS-LESS Environments, MELT '08, Jan. 1, 2008, p. 79, XP055038756, New York, USADOI: 10.1145/1410012.1410031, ISBN: 978-1-60-558189-7.

\* cited by examiner

ROUTING GRAPHS FOR BUILDINGS

CLAIM OF PRIORITY UNDER 35 U.S.C. §119

This U.S. Nonprovisional patent application claims the benefit of U.S. Provisional Patent Application No. 61/247,866, filed Oct. 1, 2009 and entitled AUTOMATIC ROUTING TOPOLOGY EXTRACTION FROM CAD MAPS; U.S. Provisional Patent Application No. 61/247,865, filed Oct. 1, 2009 and entitled SYSTEM FOR INDOOR LOCATION; U.S. Provisional Patent Application No. 61/247,869, filed Oct. 1, 2009 and entitled AUTOMATIC ROUTING TOPOLOGY EXTRACTION FROM LOW DETAIL SCHEMATICS; and U.S. Provisional Patent Application No. 61/297,524, filed Jan. 22, 2010 and entitled MAP ACQUISITION AND PROCESSING FOR LOCATION BASED SERVICES; each assigned to the assignee hereof and expressly incorporated by reference herein.

CROSS-REFERENCE(S) TO RELATED APPLICATION(S)

The present Application for Patent is related to the following co-pending U.S. Patent Application:
ROUTING GRAPHS FOR BUILDINGS USING SCHEMATICS, by Khorashadi, et al., U.S. patent application Ser. No. 12/875724, filed concurrently herewith, assigned to the assignee hereof, and expressly incorporated by reference herein.

BACKGROUND

1. Field

The subject matter disclosed herein relates to creating a routing graph based at least partly on building information.

2. Information

Maps began to be available in electronic form during the 20$^{th}$ century. With the advent of the internet, people could ultimately access maps of essentially any place in the world. Web mapping services could also provide directions from point "A" to point "B". These web-based mapping directions were relatively static. With the invention of satellite-positioning system (SPS) technology and ever-smaller electronic devices, however, so-called turn-by-turn directions could be provided dynamically as people journeyed toward their destination.

Unfortunately, these electronic maps and web-based mapping services focus on providing directions in the outdoors, such as from one postal address to another postal address. Similarly, turn-by-turn directions have been traditionally limited to roadways. An ability to provide analogous mapping and directional services indoors is currently lacking.

BRIEF DESCRIPTION OF THE FIGURES

Non-limiting and non-exhaustive aspects, features, etc. will be described with reference to the following figures, wherein like reference numerals refer to like parts throughout the various figures.

SUMMARY

Figure 1:
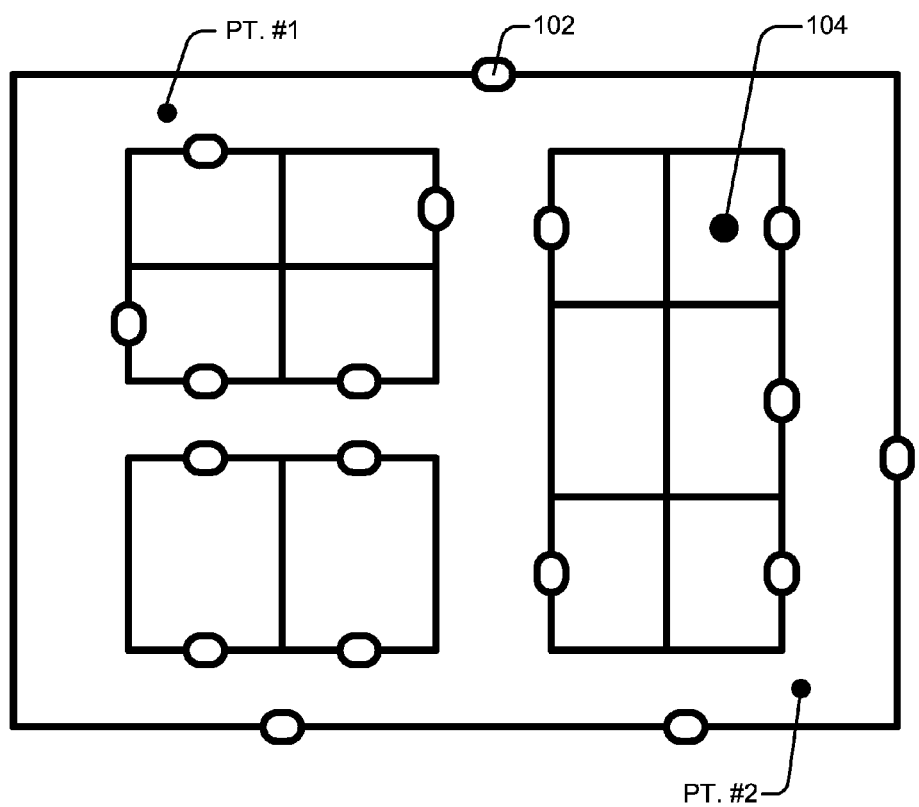
FIG. 1 is a schematic diagram of example building information having annotation information according to an implementation.

For certain example implementations, a method may comprise obtaining building information descriptive of at least a portion of a building structure and superimposing a grid of points onto the building information. At least one routing graph may be created based at least in part on the superimposed grid of points and the building information. It should be appreciated, however, that this is merely an example implementation and that other implementations are described herein and may be implemented without deviating from claimed subject matter.

DETAILED DESCRIPTION

Reference throughout this Specification to "a feature," "one feature," "an example," "one example," and so forth means that a particular feature, structure, characteristic, etc. described in connection with the feature and/or example is relevant to at least one feature and/or example of claimed subject matter. Thus, the appearances of a phrase such as "in one example," "an example," "in one feature," "a feature," "in an example implementation," and so forth in various places throughout this Specification are not necessarily all referring to the same feature, example, and/or example implementation. Furthermore, the particular features, examples, structures, characteristics, etc. may be combined in one or more example implementations, example systems, and so forth.

As indicated above, directions between two points and turn-by-turn directions are currently limited to outdoor environments, especially those having defined roadways. In contrast, building interiors typically do not offer the same mapping or navigational capabilities. In order to provide indoor navigation, a map of an environment in which a user is currently located may be used. However, a map alone may not be sufficient for indoor navigation. To aid a user navigating from one point on a map to another, a graph and associated annotation layer may be used. Such a graph is commonly referred to as a routing graph.

A grid of points may be superimposed on building information, such as a building map. The grid of points may serve as a basis for a connectivity graph that is usable to analyze the building and create a routing graph that may describe how an entity can move around the building. A routing graph with associated annotation information may describe feasible areas of a given map and indicate how traversal is possible from one point to another. For any given building, this may comprise a set of nodes and edges that depict feasible areas and traversable paths from one point in a building to another point. Unfortunately, such a routing graph with linked annotation information is not directly available from computer-aided design (CAD) maps, and many building structures are only described in a standard file format such as a CAD map. Although CAD maps tend to contain information about a structure of a building such as walls, rooms, and corridors, CAD maps do not specify or otherwise indicate how an entity can move around such a building structure. Manually drawing a routing map and identifying structures of an indoor location is not a scalable way to add the hundreds of millions of building structures with rich information to an indoor location-based service (LBS) ecosystem.

For certain example implementations that are described herein, a method may entail analyzing an existing building (e.g., CAD) file and creating a routing graph based at least partly on information that is extracted from the building CAD file. Example routing graph creation processes may be performed in an automated fashion using existing features that are common to many building CAD files. From an analysis of a CAD map, a robust routing graph having associated annotation information may be produced. Using such a routing graph, indoor positioning and/or navigational information may be provided to a user (e.g., to a mobile device thereof).

FIG. 1 is a schematic diagram 100 of example building information having annotation information 104 according to an implementation. In certain example implementations, schematic diagram 100 may represent at least a portion of a building. Its appearance may include lines, curves, arcs, polygons, and so forth, just to name a few examples. These items may be defined to represent specific features of a building structure. Examples of building structures include, but are not limited to, stadiums; arenas; convention centers; malls; a collection of buildings connected by tunnels, bridges, walkways, etc.; airports; office buildings (including those with reconfigurable walls/partitions); a combination thereof; and so forth.

Example building features include, but are not limited to, walls, doors, columns, rooms, and so forth. As illustrated, schematic diagram 100 may include multiple doors 102, annotation information 104, walls that are represented by lines, and so forth, just to name a few examples. Although all such features are not explicitly denoted with reference numerals in FIG. 1 for the sake of visual clarity, a legend indicates what building information components are connoted by which particular drawing features.

Schematic diagram 100 may include exterior walls, interior walls, rooms, hallways, interior doors, exterior doors, and so forth. However, walls, hallways, door types, etc. are usually not explicitly identified in a building map file. Although a human may be able to readily identify such building features, machines are usually not so capable. Certain example implementations as described herein enable at least some building features to be identified.

It should be understood that even after a machine identifies particular building features, machine-aided navigation may not be necessarily enabled. For example, an individual may wish to travel from point #1 of schematic diagram 100 to point #2. To enable navigational directions to be provided, a routing graph may be created for a building structure of schematic diagram 100. If a user is to be permitted to request directions to a particular room number, occupant, and/or named location, annotation information may be linked to such a routing graph. An example routing graph and annotation information are described further herein below with particular reference to FIG. 2.

In certain example implementations, a CAD or similar map of a targeted building structure may be available. Indoor navigation may be enabled using map extraction and extrapolation. With map extraction, map information present in an e.g. autoCAD file (.dwg) may be transformed to more accessible information that enables indoor location-based services such as routing, positioning, incentives applications, search, etc., just to name a few examples. For this transformation, physical map characteristics as represented in a CAD file may be manipulated and translated into structures that can be leveraged by routing modules. In addition, such an extraction and transformation process may be accomplished in automated and/or automatic manners. In fact, map extraction and translation may involve minimal to no user interaction. Furthermore, such a process may be completed in as little as a few minutes per map.

Any of the following operations may be automated in certain example implementations. Such example operations may be performed in different orders and/or such that they are fully or partially overlapping. First, feasible and infeasible locations within a building structure may be identified. Given a map, those areas that are traversable by users may be located. An interior and an exterior of a building structure may also be identified. Identifying a building exterior area (e.g., versus an interior area) may facilitate the subsequent providing of position techniques to enhance a position placement of users within a map area.

Second, autonomous areas of a map may be identified. In addition to defining feasibility, general individual areas of a map may be identified. For example, routing mechanisms may be facilitated by identifying a boundary of a given office or other room. Third, points of ingress and egress of autonomous areas within a map may be identified. In order to reach an autonomous area, such as a conference room, a user may be directed to a point of ingress/egress.

Fourth, building entry and exit points may be identified for a given building structure. To better enable both seamless indoor routing as well as indoor-to-outdoor routing, entry and exit points may be identified and included as part of or otherwise associated with a routing graph. Additionally, applications for emergency response and exit strategy may utilize such points for building entrances and exits.

Fifth, a routing graph may be created that ties multiple locations together and drives routing applications. Sixth, information from an annotation layer, such as room names and locations, may be extracted from map information and integrated with a created routing graph for use in routing, searching, position filtering (e.g., by providing constraints to a position determination module), and other applications (e.g., another location based system (LBS)). As shown by way of example in FIG. 2, rooms may be labeled with an occupant of an office space as well as a room name.

Figure 2:
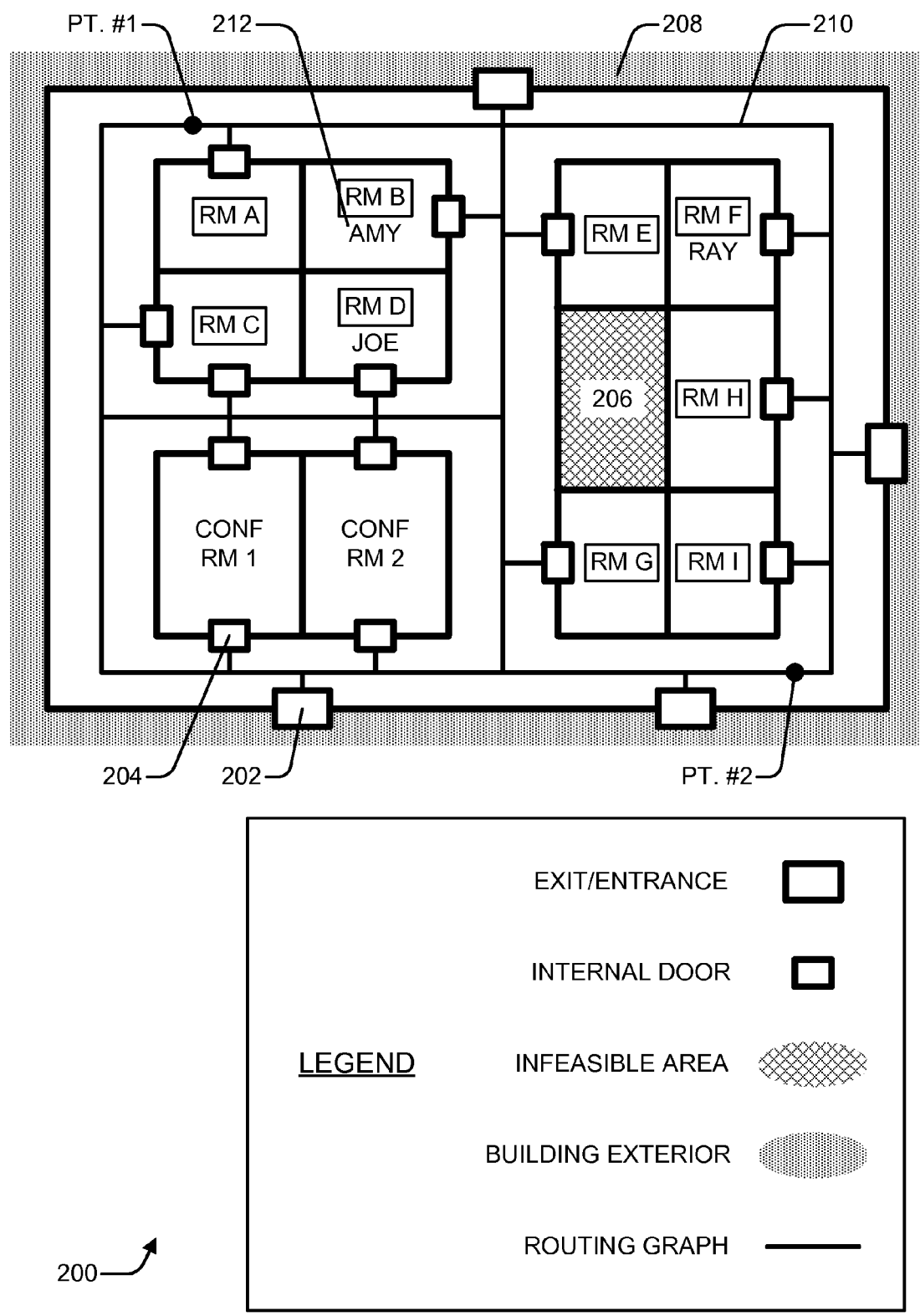
FIG. 2 is a schematic diagram of building information for which an example routing graph has been created that includes linkages to annotation information according to an implementation.

FIG. 2 is a schematic diagram 200 of building information for which an example routing graph 210 has been created that includes linkages to annotation information 212 according to an implementation. As illustrated, schematic diagram 200 may include exits/entrances 202, internal doors 204, at least one infeasible area 206, a building exterior area 208, a routing graph 210, and annotation information 212. Using routing graph 210, a navigational application and/or system may provide directional instructions for an individual to travel from, for instance, point #1 to point #2.

Although all such illustrated features are not explicitly denoted with reference numerals in FIG. 2 for the sake of visual clarity, a legend indicates what building features are connoted by which particular drawing features. Also, although schematic diagram 200 and routing graph 210 include certain example components as illustrated in FIG. 2 and described herein below, claimed subject matter is not so limited. Instead, given implementations may include more, fewer, and/or different components.

For certain example implementations, routing graph 210 indicative of a routing topology may be created to correspond to a building structure of schematic diagram 200. As part of an example analysis of building information, autonomous areas may be determined. Autonomous areas may include rooms, hallways, a building exterior, and so forth, just to name a few examples. At least one autonomous area may be ascertained to comprise a building exterior area 208. One or more other autonomous areas may be determined to comprise an infeasible area 206. Autonomous areas that are reachable may be determined to comprise feasible areas (e.g., accessible rooms, hallways, etc.). As used herein, "rooms" (or more generally zones) may include offices, cubicles, restrooms, stores, kiosks, food courts, apartments/condominiums, booths, exhibits, airport gates, attractions, other definable zones, combinations thereof, and so forth, just to name a few examples.

One or more exits and/or entrances 202 may be determined from doors included in building information if such door(s) connect to and provide access to building exterior area 208. One or more internal doors 204 may be determined to provide access to other feasible areas, such as internal rooms, hallways, and so forth. Annotation information 212 may be linked to routing graph 210 to further enable navigational or another location-based service between and among different areas (e.g., rooms, zones, etc.). By way of example but not limitation, annotation information 212 may include room designations (e.g., "A", "1.24", etc.), room names (e.g., "Conference Room 1", etc.), room purpose (e.g., "Bathroom", "Kitchen"), room resident or occupant (e.g., "Amy", "Ray", etc.), and so forth. Annotation information 212 may also provide information associated with a particular zone, such a lobby, an elevator bank, a dining location, and so forth, just to name a few examples. Routing graph 210 may be used to plot a path from one point to another point, including from one annotated area to another annotated area.

Figure 3:
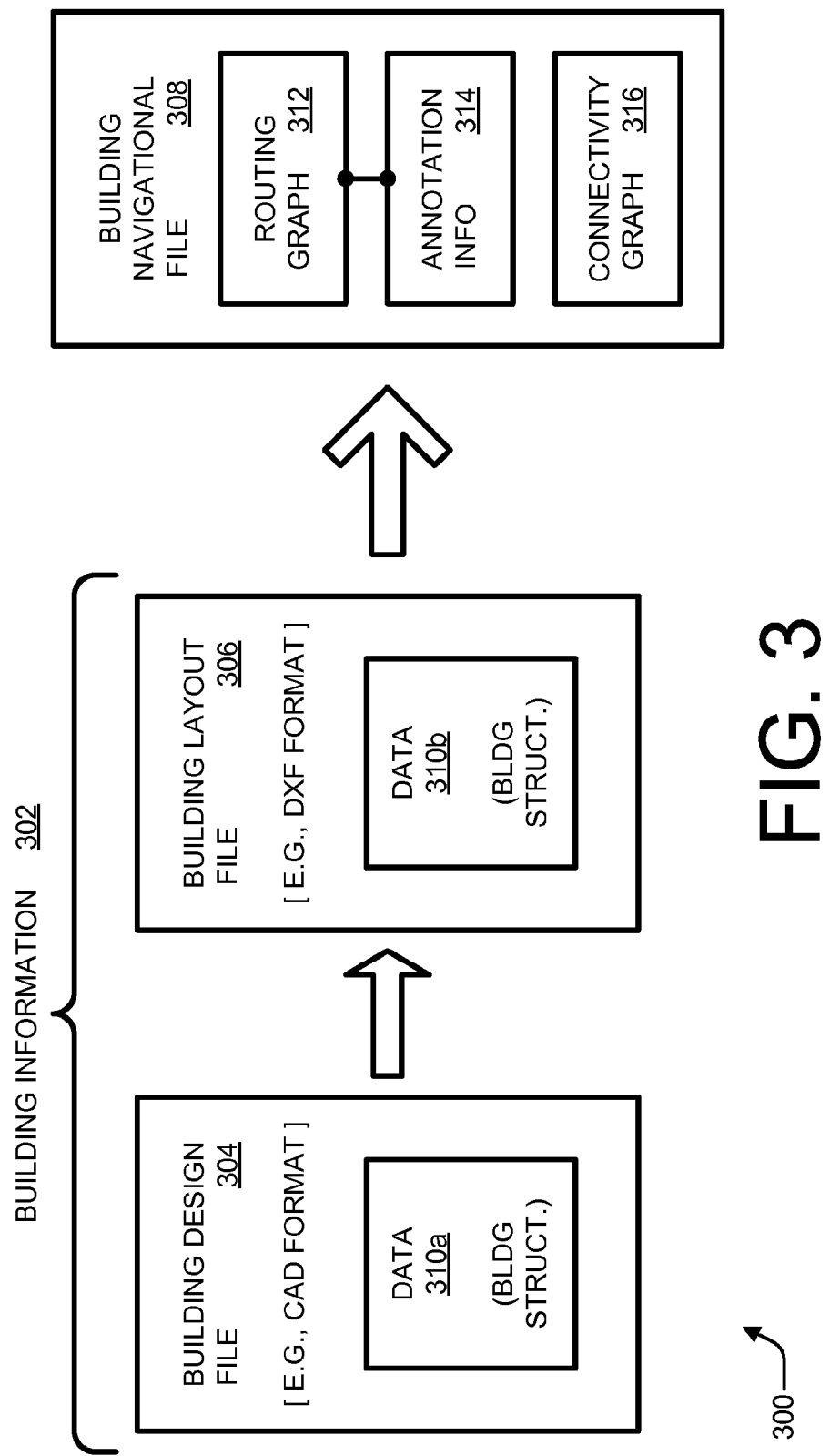
FIG. 3 is a block diagram illustrating examples of building information and a building navigational file according to an implementation.

FIG. 3 is a block diagram 300 illustrating examples of building information 302 and a building navigational file 308 according to an implementation. In certain example implementations, building information 302 may comprise any set or collection of information that describes at least a portion of a building structure. Based at least partly on building information 302, a building navigational file 308 may be created. Building navigational file 308 may include at least one routing graph 312, annotation information 314, and/or one or more connectivity graphs 316. At least routing graph 312 may be associated with or linked to annotation information 314. Building information 302, building navigational file 308, etc. may be realized as electrical signals (e.g., digital signals).

By way of example, building information 302 may include a building design file 304 and/or a building layout file 306. Building design file 304 may include data 310a that describes at least a portion of a building structure (e.g., in a CAD or similar format). Building layout file 306 may include data 310b that describes at least a portion of a building structure (e.g., in a drawing interchange/exchange format (DXF) or similar format). Examples of building information 302 are described below; however, claimed subject matter is not so limited to these examples. More specifically, building information 302 may exist in any format before or after a conversion, with or without a conversion, and so forth. Furthermore, building information 302 may be expressed in any one or more formats during a process of creating building navigational file 308. For example, a first part of building navigational file 308 may be created while building information 302 is in a first format, and a second part of building navigational file 308 may be created while building information 302 is in a second format.

In an example implementation, building design file 304 may correspond to a CAD file that contains a building structure and one or more annotation information layers. A file with a ".dwg" extension may be converted to a file with a ".dxf" extension, which is an open format type that may be parsed through the use of text parsing utilities. Generally, a proprietary format (e.g., such as a ".dwg" file, etc.) may be converted to any interchange format having a publicly-known syntax (e.g., such as a ".dxf" file, etc.). Operator interaction may be involved at this time to identify which annotation layer or layers within a CAD file are annotation layers to be linked to a created routing graph. For example, if room names are desired to be linked, a name of such a layer may be selected or otherwise identified by an operator. Such a layer (e.g., "room layer") may be separately labeled within a CAD file. Alternatively, annotation layer selection may be performed automatically, may be automated in accordance with one or more rules, some combination thereof, and so forth, just to name a few examples.

Once a dxf-formatted file is obtained, structural information of at least a portion of a building may be extracted. Such information may relate to walls, windows, doors, columns, etc., just to name a few examples. With a dxf-formatted file, building information features may be represented by lines, arcs, and so forth. More specifically, after a dxf-formatted file has been parsed, information such as a wall may be represented by line segments and information such as a door may be represented by a line segment and an arc.

There may be no information indicating, for instance, that a particular wall is the wall of "Room A" or that a particular door is an external exit/entrance. However, such building feature information may be processed and some other layers may be inferred from the extracted information. For example, in order to identify a bounding box for a particular room (e.g., "Room A"), location information may be extracted from a room annotation layer. A room annotation layer may indicate a coordinate point in space (e.g., x=22, y=758) that identifies "Room A". Using this information, e.g., a smallest enclosing or autonomous area around this point may be determined and labeled Room A for routing purposes. An example approach to this annotation information linking process is described further herein below with particular reference to FIG. 10.

Figure 4:
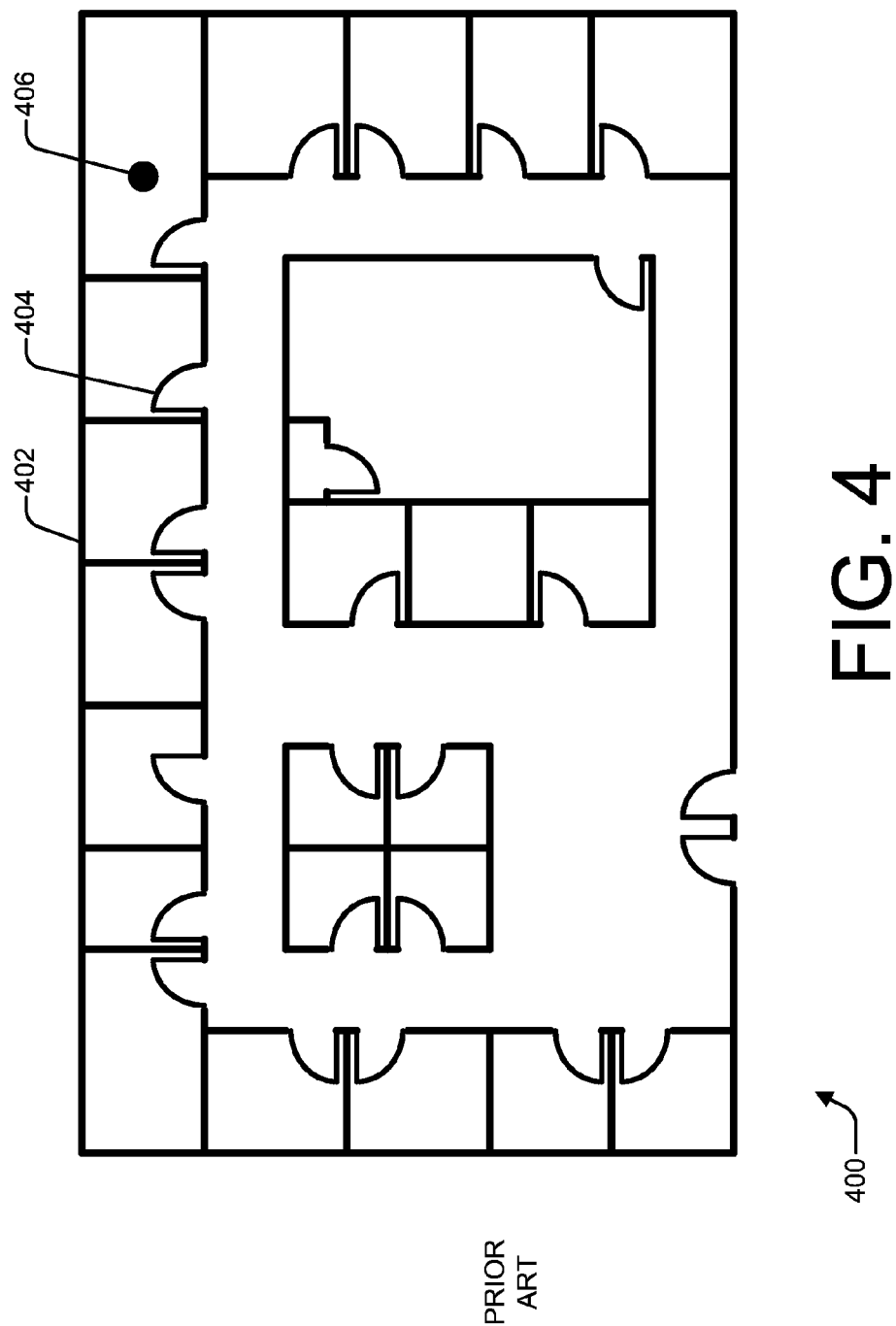
FIG. 4 is a schematic diagram of example building information according to an implementation.

FIG. 4 is a schematic diagram of example building information 400 according to an implementation. Building information 400 may be an example of building information 302 (of FIG. 3). Hence, building information 400 may be in a CAD format, a text parse-able format, a combination thereof, or any other type or types of formats. For certain example implementations, building information 400 may include items that represent one or more building features.

As illustrated, building information 400 includes at least walls 402 and doors 404. "Doors" 404 may also include stairwells, elevators, and so forth, just to name a few examples. Moreover, any feature that provides an initial entrance to (or a final exit from) a floor of a building may be considered a door 404. Furthermore, more or different components representing building features may alternatively be included as part of building information 400. Building information 400 may also include annotation information 406. Building information 400, expressing a portion of such a building structure, is used to illustrated example concepts, starting with FIG. 5.

Figure 5:
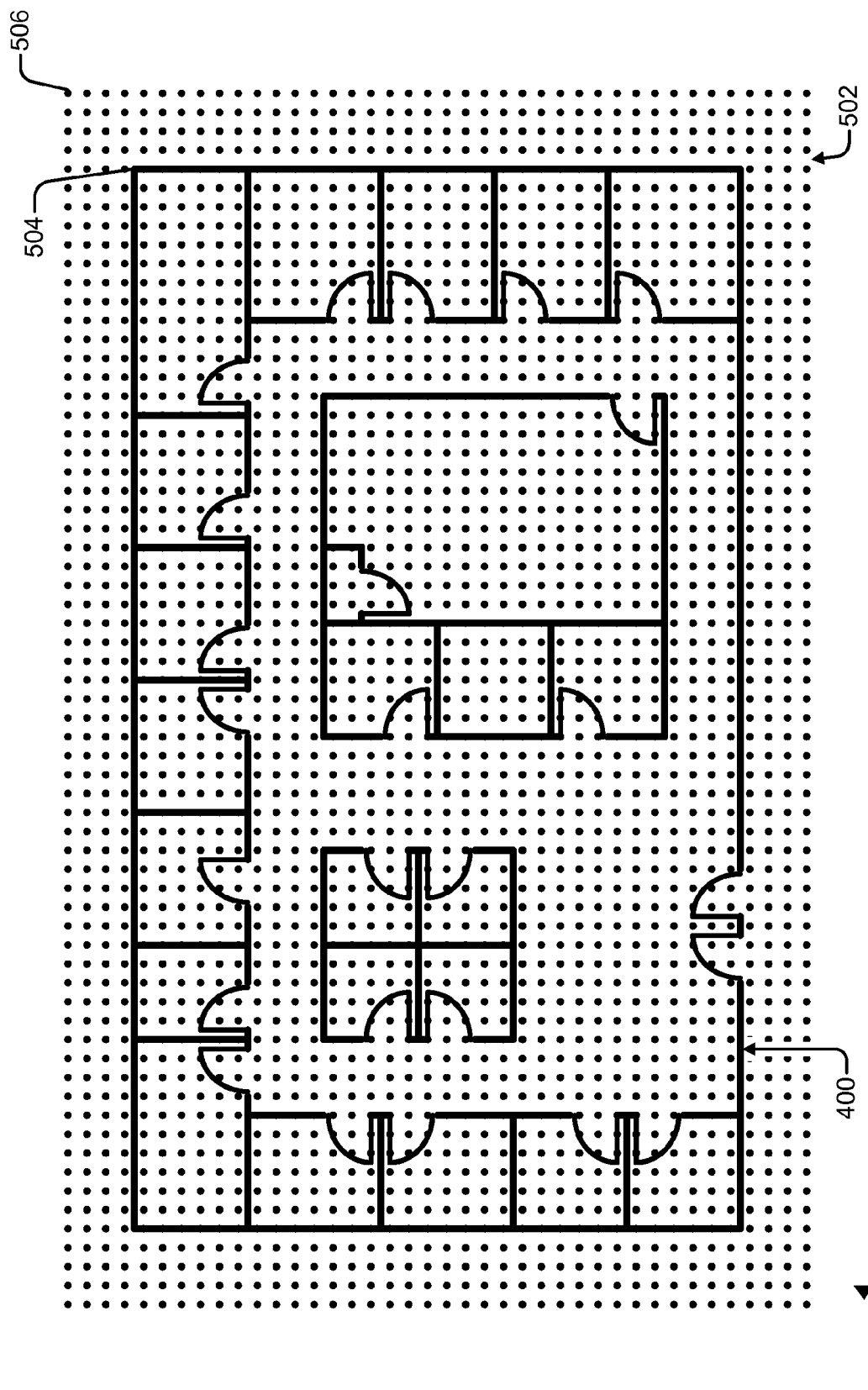
FIG. 5 is a schematic diagram of building information on which an example grid of points has been superimposed according to an implementation.

FIG. 5 is a schematic diagram 500 of building information 400 on which an example grid of points 502 has been superimposed according to an implementation. As illustrated, schematic diagram 500 may include building information 400, a grid of points 502, an extreme building structure point 504, and an external point 506. For certain example implementations, grid of points 502 may be superimposed to building information 400. Grid of points 502 may be, by way of example but not limitation, a set of points that are located at regular intervals along two axes (e.g., an x-axis and a y-axis). Grid of points 502 may cover a portion of, substantially all, all, or more than all of a building structure of building information 400. As shown, grid of points 502 extends beyond outer boundaries of a building structure of building information 400.

A resolution or scale of a grid of points (e.g., an interval distance between two adjacent points) may be varied. A resolution may be varied, for example, based on a desired level of precision for location-based services (e.g., navigational mapping accuracy), an available amount of resources (e.g., memory, processing, and/or time) that can be allotted to analyzing building information, an actual or expected size of rooms or other autonomous areas, and so forth, just to name a few examples. A scale may also be varied within a single grid of points to account for different desired levels of resolution within a single building structure. In an example implementation, a number of grid points may be determined by a size of a map being covered. A size of a map may be calculated automatically by finding coordinates of each of the features in a map such as lines, arcs, etc. and by finding a lowest and highest x-coordinate and y-coordinate thereof. Some CAD files, moreover, may have an origin in the negative quadrant, such as at −1400, −200. In such cases, a map extraction process may translate the lowest x-coordinate and y-coordinate of a map to be the origin at 0,0 and translate other features accordingly. Such a translation, if performed, may facilitate understanding of coordinates associated with features, POIs (points of interest), etc. of a map. POIs may include stores, rooms, terminals/gates, exhibits, and so forth, just to name a few examples. For instance, it is relatively comprehensible to indicate that a given room is 200 feet from a left corner of a building, which may be defined via translation to be at the origin 0,0.

External point 506 may be determined based, at least in part, on an extreme building structure point 504. As shown, extreme building structure point 504 is a right-most, top-most point of a building structure (e.g., a point of a building structure having the greatest x-y coordinate). Alternatively, an extreme building structure point 504 may have a smallest x-coordinate and y-coordinate; may be a right-most, bottom-most point; may be a left-most point having a greatest y-coordinate; and so forth. Once an extreme building structure point 504 (e.g., a greatest coordinate (x,y) of a building structure) is selected, an external point 506 may be determined based at least partly thereon, such as by changing at least one of the x-y coordinates a predetermined amount. For example, external point 506 may be determined by adding a delta_x to an x-coordinate of extreme building structure point 504 and by adding a delta_y to a y-coordinate of extreme building structure point 504 (e.g., to determine an external coordinate of (x+delta_x, y+delta_y)). As described herein below, external point 506 may be used in a determination of an exterior area of a building structure.

A "gridization" of a building structure to superimpose a grid of points 502 may be started at an external point 506. This can be accomplished by starting at external point 506 and adding points at, e.g., one foot intervals in multiple directions until an entirety of a desired portion of a building is covered, including all of a building or building floor. A maximum area around a building may be determined by locating min and max values for x and y coordinates of any object (e.g., line segment, door, annotation layer, etc.) extracted from a building information file.

Figure 6:
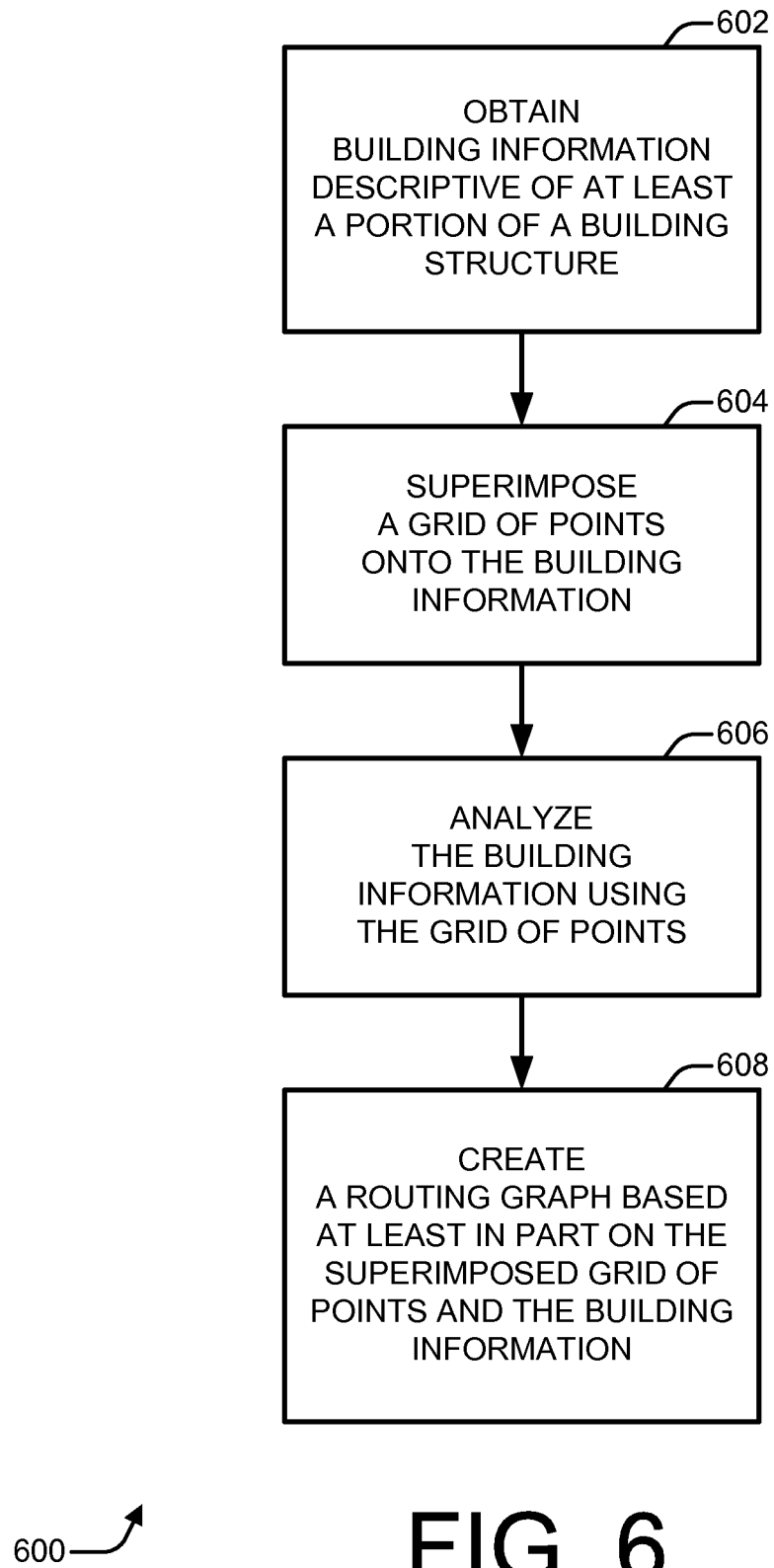
FIG. 6 is a flow diagram illustrating an example method for creating a routing graph based at least partly on building information according to an implementation.

FIG. 6 is a flow diagram 600 illustrating an example method for creating a routing graph based at least partly on building information according to an implementation. As illustrated, flow diagram 600 includes four operational blocks 602, 604, 606, and 608. Although operations 602-608 are shown and described in a particular order, it should be understood that methods may be performed in alternative manners without departing from claimed subject matter. Also, operations of flow diagram 600 may be performed fully or partially overlapping one another. Additionally, although the description below references particular aspects and features illustrated in certain other figures (e.g., FIGS. 3-5), methods may be performed with other aspects and/or features.

For certain example implementations, at operation 602, building information descriptive of at least a portion of a building structure may be obtained. For example, building information 302 that is descriptive of at least a portion of a building structure (e.g., as shown in FIG. 4 as building information 400) may be obtained. Building information 302 may be obtained by retrieving it from memory, by receiving it over a wireless or wired communication link, and so forth, just to name a few examples. At operation 604, a grid of points may be superimposed onto the building information. For example, a grid of points 502 may be superimposed onto building information 400.

At operation 606, the building information may be analyzed using the grid of points. For example, analysis of building information 400 using grid of points 502 may enable autonomous areas to be determined, building entrances and exits to be determined, feasible versus infeasible areas to be determined, hallways to be detected, and so forth, just to name a few examples. Example approaches to analyzing building information using a grid of points is described further herein below with particular reference to FIG. 7. At operation 608, a routing graph may be created based at least in part on the superimposed grid of points and the building information (e.g., electrical signals (e.g., digital signals) representing at least one routing graph may be generated). For example, a routing graph 312 with linkages to annotation information 314 may be created for building information 400 based at least in part on a superimposed grid of points 502 and building information 302.

Such a routing graph may be stored for subsequent use by a same or a different device and/or used immediately or substantially immediately after creation. For example, a database of routing graphs may be stored for subsequent retrieval and application to location-based services. Alternatively, a device (e.g., a mobile device) may create a routing graph and then use it for navigation or other location-based application(s) on-demand. Regardless, navigational information (e.g., directions, a full or partial routing graph, etc.) relating to a building structure may be provided to a mobile device using at least one routing graph.

Figure 7:
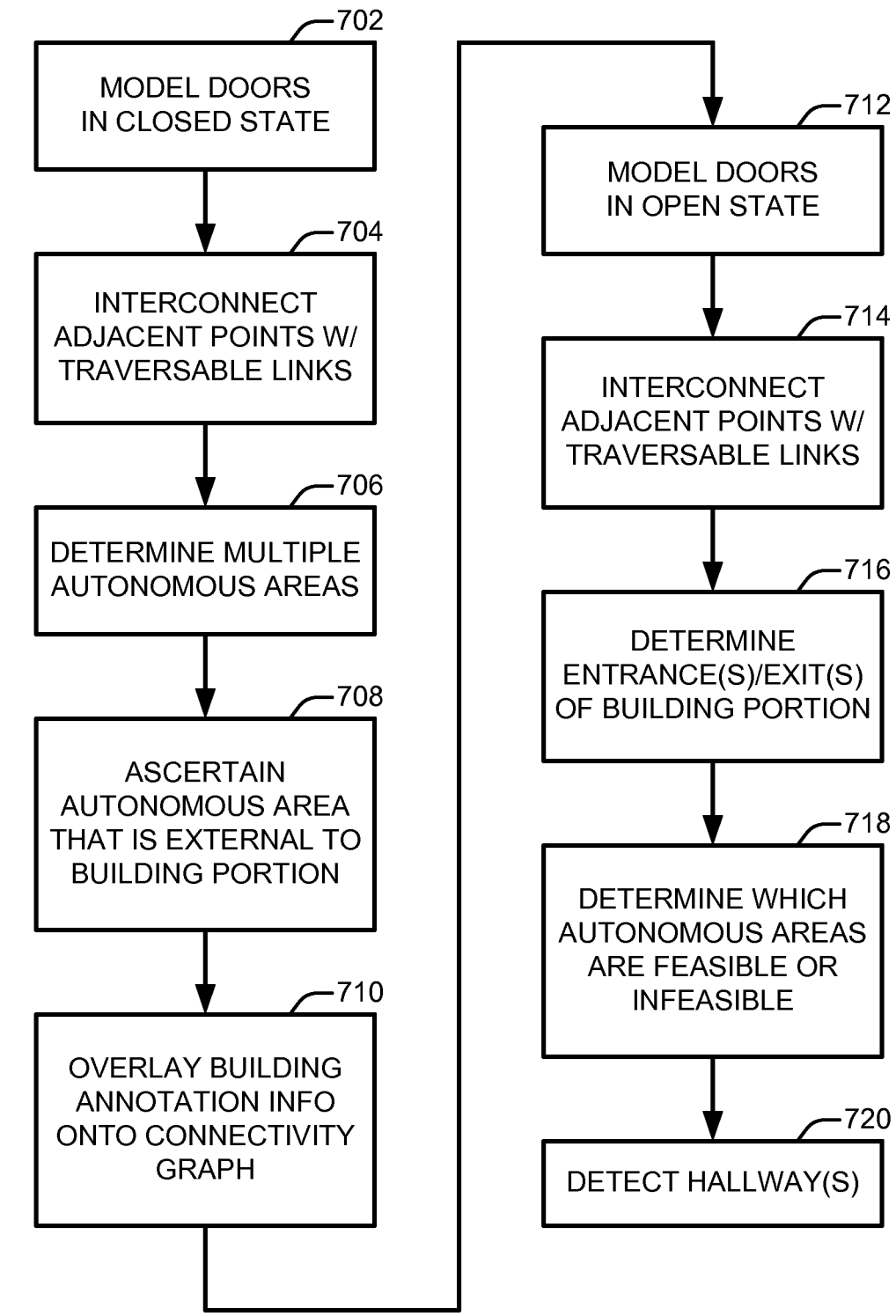
FIG. 7 is a flow diagram illustrating an example method for analyzing building information to create a routing graph according to an implementation.

FIG. 7 is a flow diagram 700 illustrating an example method for analyzing building information to create a routing graph according to an implementation. As illustrated, flow diagram 700 includes ten operational blocks 702-720. Although operations 702-720 are shown and described in a particular order, it should be understood that methods may be performed in alternative manners without departing from claimed subject matter. Also, operations of flow diagram 700 may be performed fully or partially overlapping with one another. Additionally, although the description below references particular aspects and features illustrated in certain other figures (e.g., FIGS. 3-5 and 8-13), methods may be performed with other aspects and/or features.

At operation 702, doors may be modeled in a closed state. For example, doors of building information 400 may be considered as being closed. At operation 704, adjacent points of a grid of points (e.g., grid of points 502) may be interconnected with traversable links. For example, from a given point, links may be established between up to eight neighboring points if such a link does not intersect a building feature to form at least a portion of a connectivity graph 316. With doors being in a closed state, this interconnection may form multiple disconnected graphs.

At operation 706, multiple autonomous areas may be determined. For example, multiple autonomous areas may be determined based at least partly on multiple disconnected graphs that are formed from interconnecting adjacent points with traversable links while doors are closed. At operation 708, at least one autonomous area that is external to a building portion may be ascertained. For example, using a point that is identified as being external to a building portion (e.g., external point 506), an external autonomous area may be ascertained.

Example implementations for operations 702-708 are described further herein below with particular reference to FIG. 9. At operation 710, building annotation information may be overlain on a connectivity graph. For example, annotation information 314 may be linked to at least one connectivity graph 316. Example implementations for operation 710 are described further herein below with particular reference to FIG. 10.

At operation 712, doors may be modeled in an open state. For example, doors of building information 400 may be considered as being open. Furthermore, a door point (e.g., a point representing a location of a door) may be added to a grid of points for each opened door. At operation 714, adjacent points of a grid of points (e.g., grid of points 502) may be interconnected with traversable links. Such interconnected points may include nodes added as door points. If points are already interconnected (e.g., from operation 704), newly-added door points may be interconnected to existing disconnected graphs. Hence, door points may be connected to other points of a grid of points to form at least one interconnected graph.

At operation 716, one or more entrances/exits for at least a portion of a building structure may be determined. For example, those door(s) that directly connect (e.g., via a traversable link) to an external autonomous area may be determined to be building entrance(s)/exit(s). Example implementations for operations 712-716 are described further herein below with particular reference to FIG. 11.

At operation 718, which autonomous areas are feasible and whether one or more autonomous areas are infeasible may be determined. For example, whether one or more autonomous areas are reachable or not from an external point may be determined Example implementations for operation 718 are described further herein below with particular reference to FIG. 12. At operation 720, one or more hallways may be detected. For example, whether one or more autonomous areas comprise at least one hallway may be detected based at least partly on a number of doors to which each autonomous area is directly connected. Although autonomous areas may be determined with doors modeled in a closed state (e.g., from operation 706), hallway detection may be performed with doors modeled in any state. Example implementations for operation 720 are described further herein below with particular reference to FIG. 13.

Figure 8:
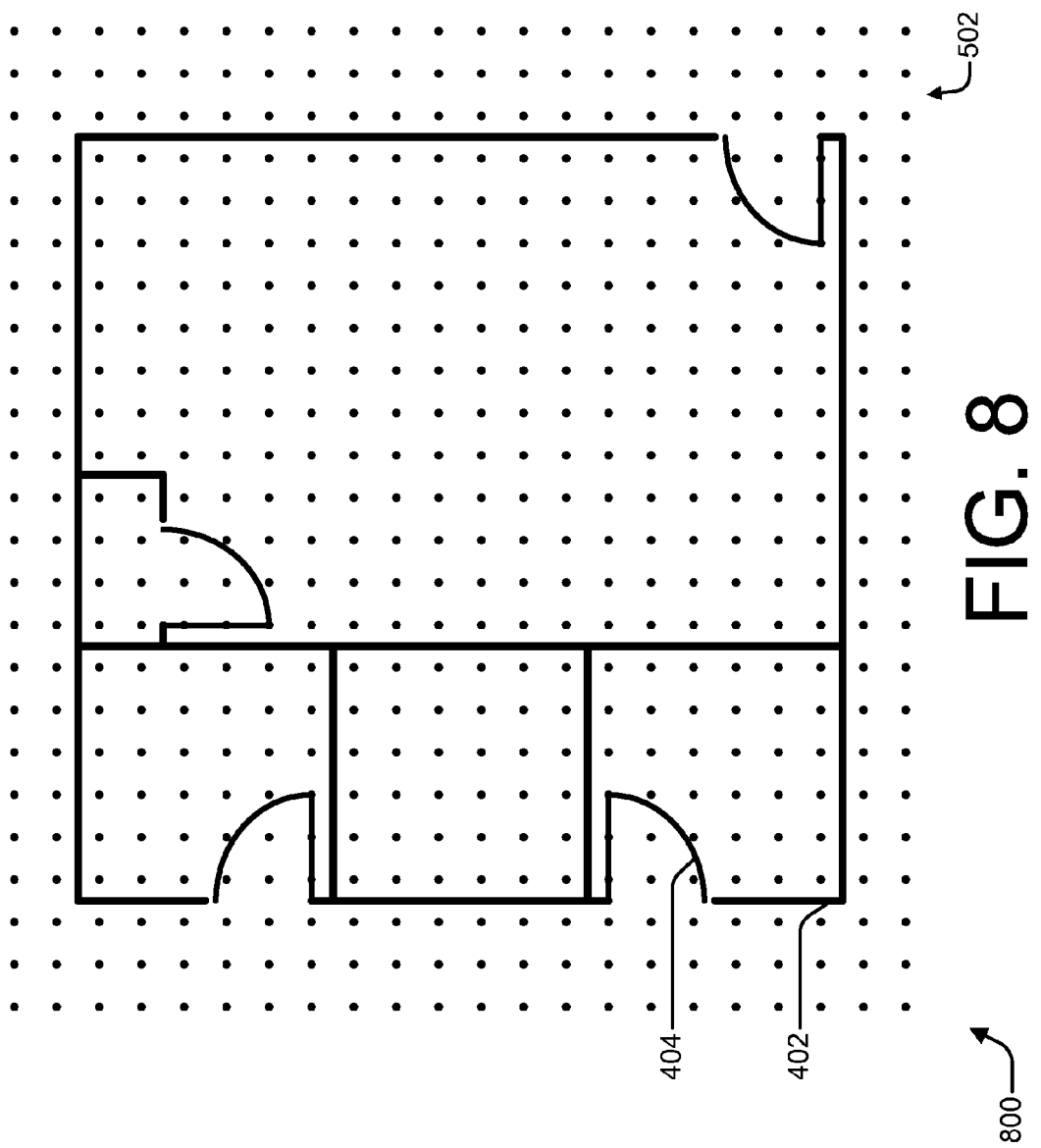
FIG. 8 is a schematic diagram of an example building portion on which a grid of points has been superimposed according to an implementation.

FIG. 8 is a schematic diagram of an example building portion 800 on which a grid of points 502 has been superimposed according to an implementation. As illustrated for the sake of clarity, building portion 800 is part of (e.g., a cross-section of) building information 400 (of FIG. 4). It has been enlarged to show additional detail in FIG. 8, as well as FIGS. 9-12. FIGS. 9-12 generally illustrate different aspects and/or implementations using building portion 800. In FIG. 8, building portion 800 includes walls 402 and doors 404. Although not shown in FIG. 8, an extreme building structure point 504, an external point 506 (both of FIG. 5), and an external corner of a building structure are represented in FIGS. 9 and 11.

Figure 9:
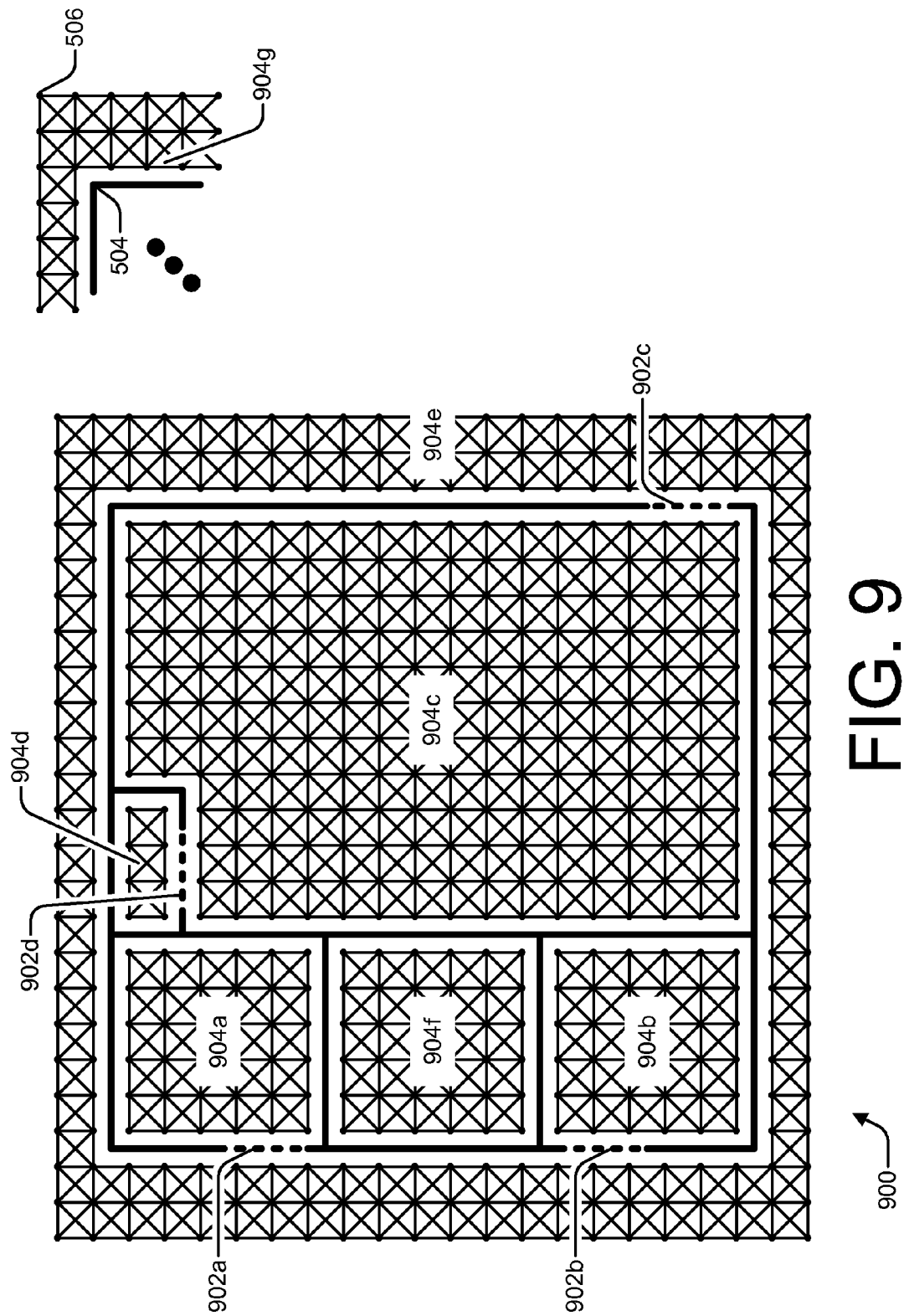
FIG. 9 is a schematic diagram of an example building portion in which doors are modeled in a closed state and autonomous areas may be determined from interconnected points according to an implementation.

FIG. 9 is a schematic diagram 900 of an example building portion in which doors 902 are modeled in a closed state and autonomous areas 904 may be determined from interconnected points according to an implementation. For certain example implementations, at least some operations may be performed with doors 902 being modeled in a closed state, as shown in schematic diagram 900. (In an alternative formulation, closed doors may be considered equivalent to temporarily replacing doors with walls.) Specifically, four doors 902a, 902b, 902c, and 902d are shown. By modeling doors as being closed, autonomous areas may be separated.

With doors 902 being closed, points from a grid of points (e.g., grid of points 502 of FIG. 8) may be interconnected to adjacent points with traversable links. Interconnection of points may be started, e.g., from any arbitrary point. Any point which falls directly on a wall, closed door, or other building structure may be ignored. A link between two points (e.g., from a first point to a second point) may be considered traversable if, for example, such link does not impact and/or intersect a building feature, such as a wall, a column, a closed door, and so forth. Two points may be considered adjacent, for example, if they are neighbors (e.g., a second point is one of eight points near a first point). For example, for point (i,j), a link, if traversable, may be drawn between point (i,j) and up to each of eight immediately surrounding points (i−1,j), (i+1,j), (i,j−1), (i,j+1), (i−1,j−1), (i+1,j+1), (i−1,j+1), and (i+1,j−1). However, claimed subject matter is not so limited to this particular interconnection approach.

By interconnecting adjacent points with traversable links while doors 902 are closed, multiple disconnected graphs (e.g., multiple disconnected connectivity graphs) may be formed. Such multiple disconnected graphs may be considered to comprise multiple autonomous areas 904. Specifically, seven autonomous areas 904a, 904b, 904c, 904d, 904e, 904f, and 904g are shown. Four autonomous areas 904a, 904b, 904c, and 904d are formed at least partly as a result of "closing" doors 902a, 902b, 902c, and 902d. As is apparent from a comparison of FIGS. 8 and 9 with FIGS. 4 and 5, autonomous area 904e, which is part of a hallway, is shown partially in schematic diagram 900. Autonomous area 904f is not directly connected to a door. Autonomous area 904f is discussed further herein below with particular reference to FIG. 12.

An external point 506 is a point forming part of autonomous area 904g. If an autonomous area 904 includes at least one external point 506, such an autonomous area 904 may be considered to comprise an external area with respect to a building structure. Hence, autonomous area 904g may be determined to comprise an autonomous area that is external to a building structure.

Figure 10:
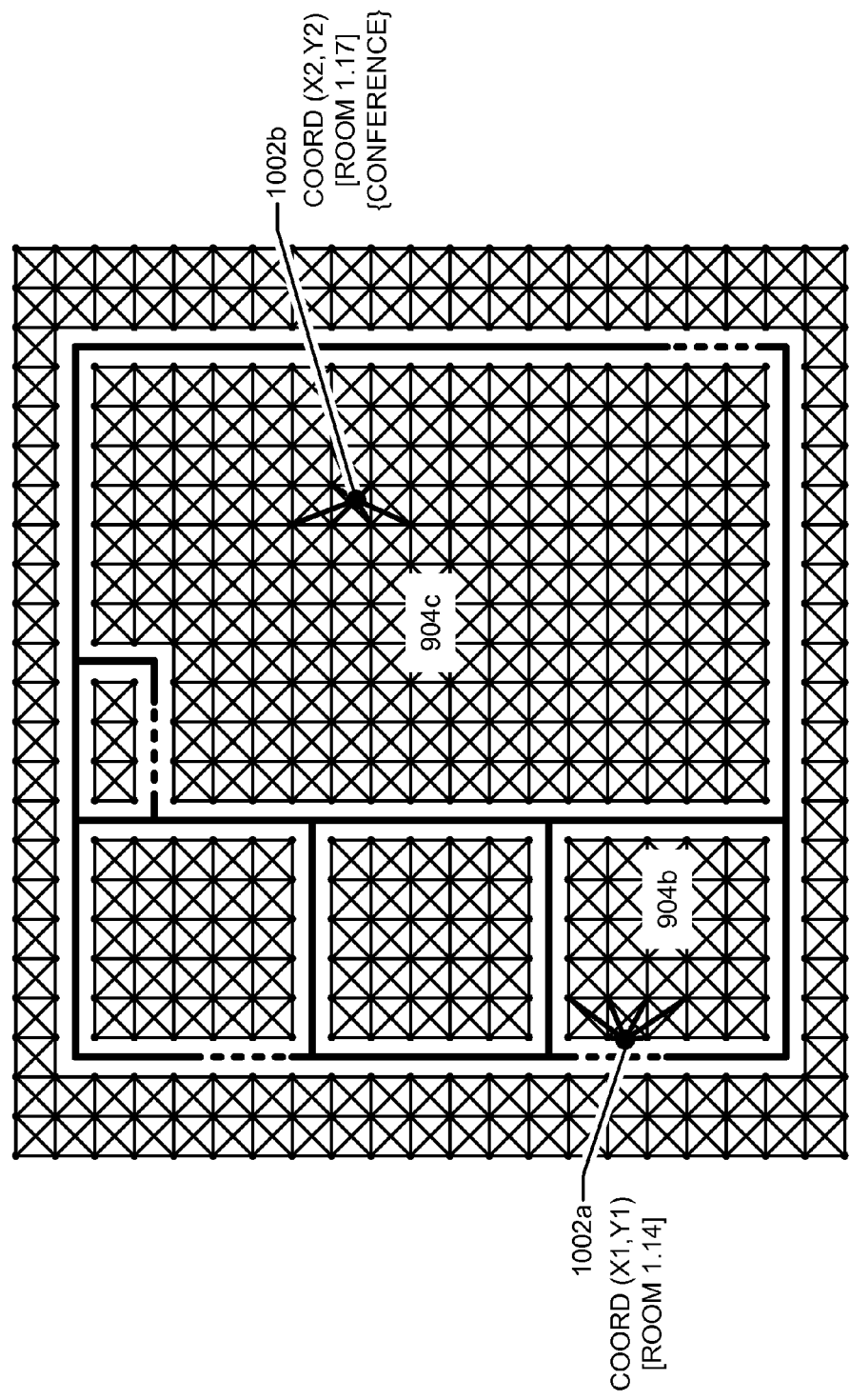
FIG. 10 is a schematic diagram of an example building portion in which doors are modeled in a closed state and annotation information is overlaid onto multiple disconnected graphs according to an implementation.
Figure 11:
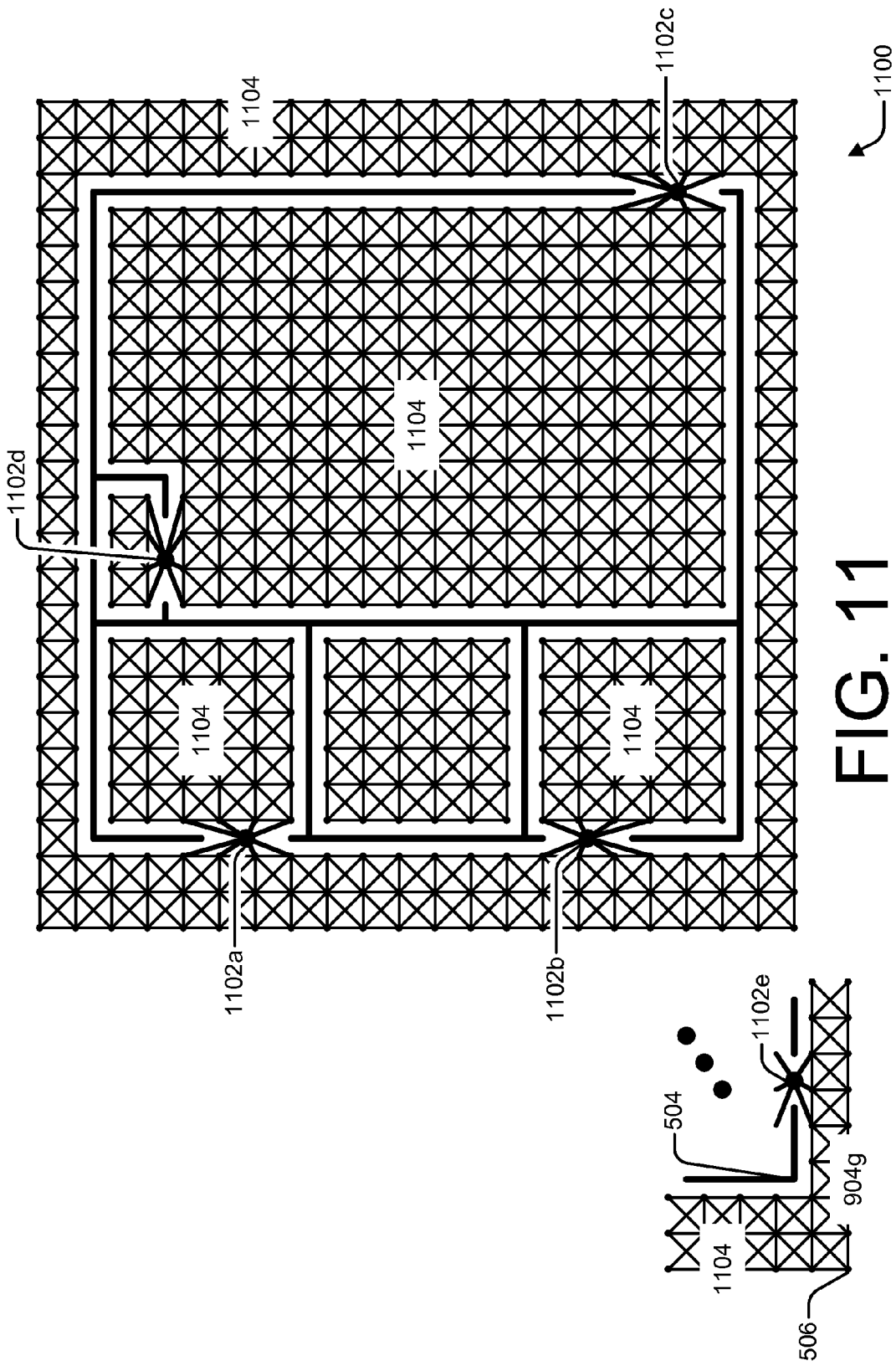
FIG. 11 is a schematic diagram of an example building portion in which doors are modeled in an open state and entrance(s) and exit(s) may be determined according to an implementation.

FIG. 10 is a schematic diagram 1000 of an example building portion in which doors are modeled in a closed state and annotation information 1002 is overlaid onto multiple disconnected graphs according to an implementation. Annotation information (e.g., annotation information 406) may be included as part of building information (e.g., building information 400). For certain example implementations, such annotation information may be overlaid on a routing graph. One or more annotation layers of annotation information (e.g., building information 302) may be selected automatically, in accordance with a set of rules, manually, some combination thereof, and so forth, just to name a few examples.

A particular item of annotation information may be associated with a coordinate on a map of building information. Coordinates may be in an x-coordinate, y-coordinate form, or in some other form. Coordinates may be provided, by way of example but not limitation, in terms of physical distance, scaled distance, pixel or dot count, some combination thereof, and so forth. However, claimed subject matter is not limited by the form, format, etc. of coordinate information.

Two items of annotation information 1002 are shown. However, fewer or more than two such items of annotation information 1002 may alternatively be present and linked to a routing graph. As illustrated, annotation information 1002a is associated with a coordinate (X1,Y1) and includes "ROOM 1.14" data. Annotation information 1002b is associated with a coordinate (X2,Y2) and includes "ROOM 1.17" and "CONFERENCE" data. This data may be linked to a particular autonomous area 904 as follows.

A given coordinate point of annotation information 1002 may be connected to a disconnected graph corresponding to an autonomous area. Because each such graph may be fully disconnected at this time in accordance with an example implementation in which doors are closed, a coordinate point will be able to connect to at most one of such multiple disconnected connectivity graphs. Thus, a coordinate point may be inserted into a gridized building map area and traversable links may be drawn from that coordinate point to other point(s). In example manners such as these, extracted annotation layers may be linked to their corresponding autonomous areas.

By way of specific example, a coordinate (X1,Y1) of annotation information 1002a may be connected to point(s) of autonomous area 904b with traversable link(s). Accordingly, data "ROOM 1.14" of annotation information 1002a may be linked to autonomous area 904b. Similarly, a coordinate (X2, Y2) of annotation information 1002b may be connected to point(s) of autonomous area 904c with traversable link(s).

Accordingly, data "ROOM 1.17" and/or "CONFERENCE" of annotation information 1002b may be linked to autonomous area 904c.

FIG. 11 is a schematic diagram 1100 of an example building portion in which doors 1102 are modeled in an open state and entrance(s) and exit(s) may be determined according to an implementation. For certain example implementations, at least some operations may be performed with doors 1102 being modeled in an open state (or, equivalently, with temporary walls removed), as shown in schematic diagram 1100. Specifically, five doors 1102a, 1102b, 1102c, 1102d, and 1102e are shown. As illustrated, each open door 1102 may be modeled using at least one point as a door node for a routing graph. Every door, however, may not be an entrance/exit point; doors that lead merely to an internal room may not be considered entrance/exit points.

With doors 1102 being open, points from a grid of points (e.g., grid of points 502 of FIG. 8) may be interconnected with adjacent points using traversable links. Such grid of points may also include points for open doors 1102. Door points 1102 may be attempted to be directly connected to autonomous areas (e.g., those that correspond to disconnected graphs when doors are modeled in a closed state) with traversable links. By interconnecting adjacent points with traversable links while doors 1102 are open and modeled with door points, at least one connected graph 1104 may be formed.

As explained herein above for operation 708 (of FIG. 7) and also with particular reference to FIG. 9, at least one autonomous area may be ascertained as corresponding to an exterior area of a building structure. In an example implementation, autonomous area 904g may be ascertained to correspond to an exterior area. With doors being modeled in an open state, autonomous area 904g may also comprise at least part of connected graph 1104. It should also be noted that in schematic diagram 1100 an extreme building structure point 504 may be located at a left-most, bottom-most point of a building structure (e.g., at a building feature having a minimum x and a minimum y coordinate).

In an example implementation, traversable links may be attempted to be drawn from each point in an ascertained exterior area, such as autonomous area 904g, to each point corresponding to a door. If a door 1102 may be connected to a point of autonomous area 904g by a traversable link, such a door may be determined to be an entrance/exit of a building structure. Hence, door 1102e may be determined to comprise at least one entrance/exit of a building structure.

Before, during, and/or after when entrance/exit points are identified, doors generally (e.g., both interior and exterior doors) may be connected to autonomous areas using traversable links. For certain example implementations, infeasible areas may be determined to be areas that fail to connect to at least one entrance/exit point. An example approach is described further below with particular reference to FIG. 12.

Figure 12:
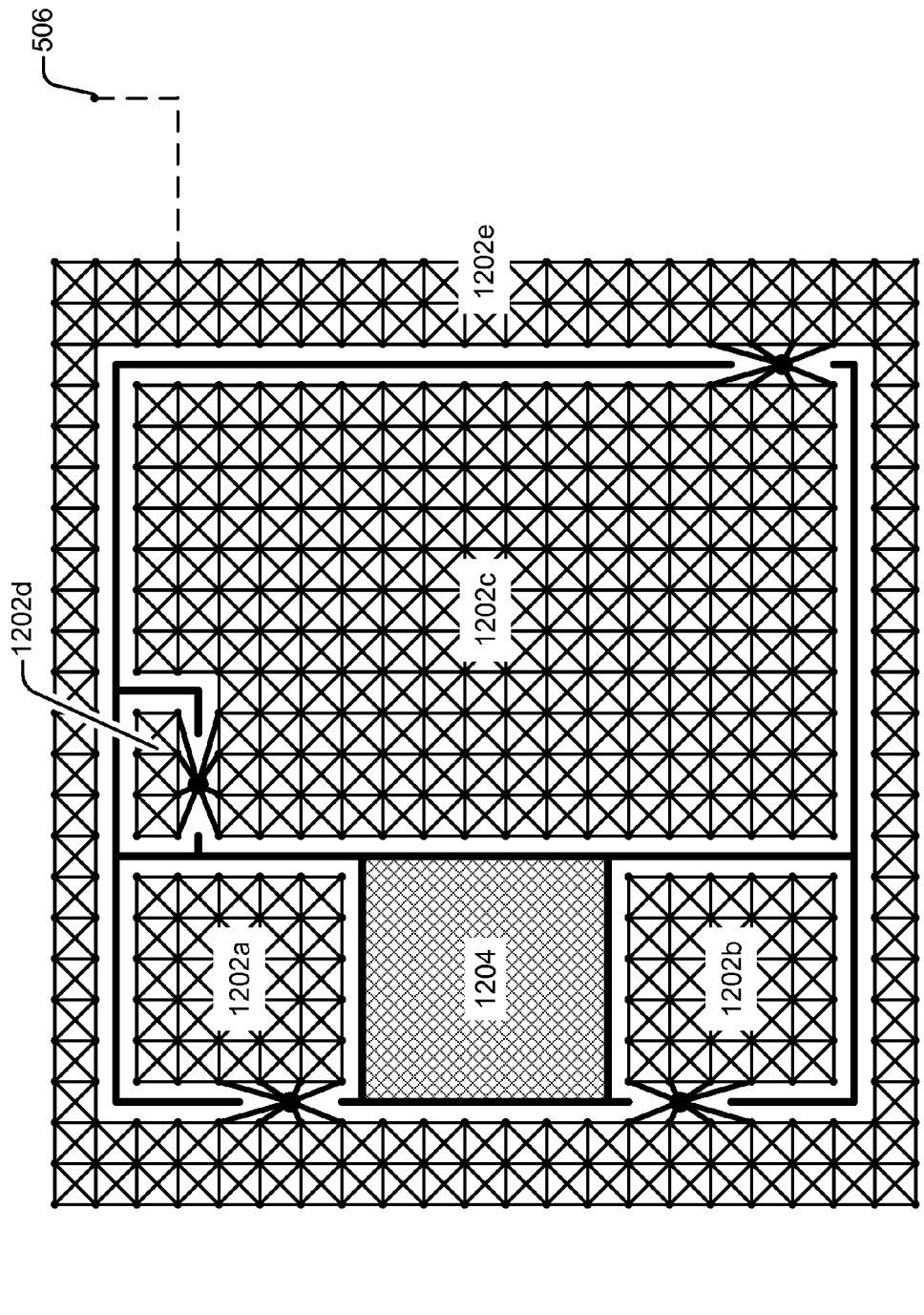
FIG. 12 is a schematic diagram of an example building portion in which doors are modeled in an open state and autonomous areas may be determined to be feasible or infeasible according to an implementation.

FIG. 12 is a schematic diagram 1200 of an example building portion in which doors are modeled in an open state and autonomous areas may be determined to be feasible or infeasible according to an implementation. For certain example implementations, each autonomous area may be analyzed with regard to whether it is reachable from an external point 506 via a routing graph. If an autonomous area is reachable from external point 506, it may be considered to comprise a feasible area 1202. On the other hand, if an autonomous area is not reachable from external point 506, it may be considered to comprise an infeasible area 1204.

In an example implementation, a comparison of FIGS. 5 and 8 with FIG. 12 reveals that the outer area of schematic diagram 1200 is reachable by external point 506. Hence, area 1202e may be considered to comprise a feasible area 1202e. Similarly, areas 1202a, 1202b, 1202c, and 1202d may be considered to comprise feasible areas as they too are reachable from external point 506. Area 1204, on the other hand, is not reachable along a routing graph from external point 506. Hence, area 1204 may be considered to comprise an infeasible area 1204.

At least after disconnected graphs of autonomous areas that comprise feasible areas are interconnected by traversable links, a routing graph may be created from at least one connectivity graph. Points of a grid of points may comprise nodes of such a routing graph, and links interconnecting points may comprise edges of such a routing graph. Furthermore, points of interest may be linked/connected to their corresponding autonomous areas, along with categorizing inaccessible areas as infeasible locations. Routing from one location to another may be performed by selecting two points/nodes in a routing graph and running, e.g., a shortest path algorithm (e.g., Dijkstra, etc.) on the remaining graph. Navigational instructions (including, but not limited to, real-time and/or turn-by-turn directions) may be provided using such a routing graph. Furthermore, other location-based services (e.g., positioning, position filtering, etc.) may alternatively and/or additionally be provided to a user (e.g., of a mobile device) based at least partly on a created routing graph.

Figure 13:
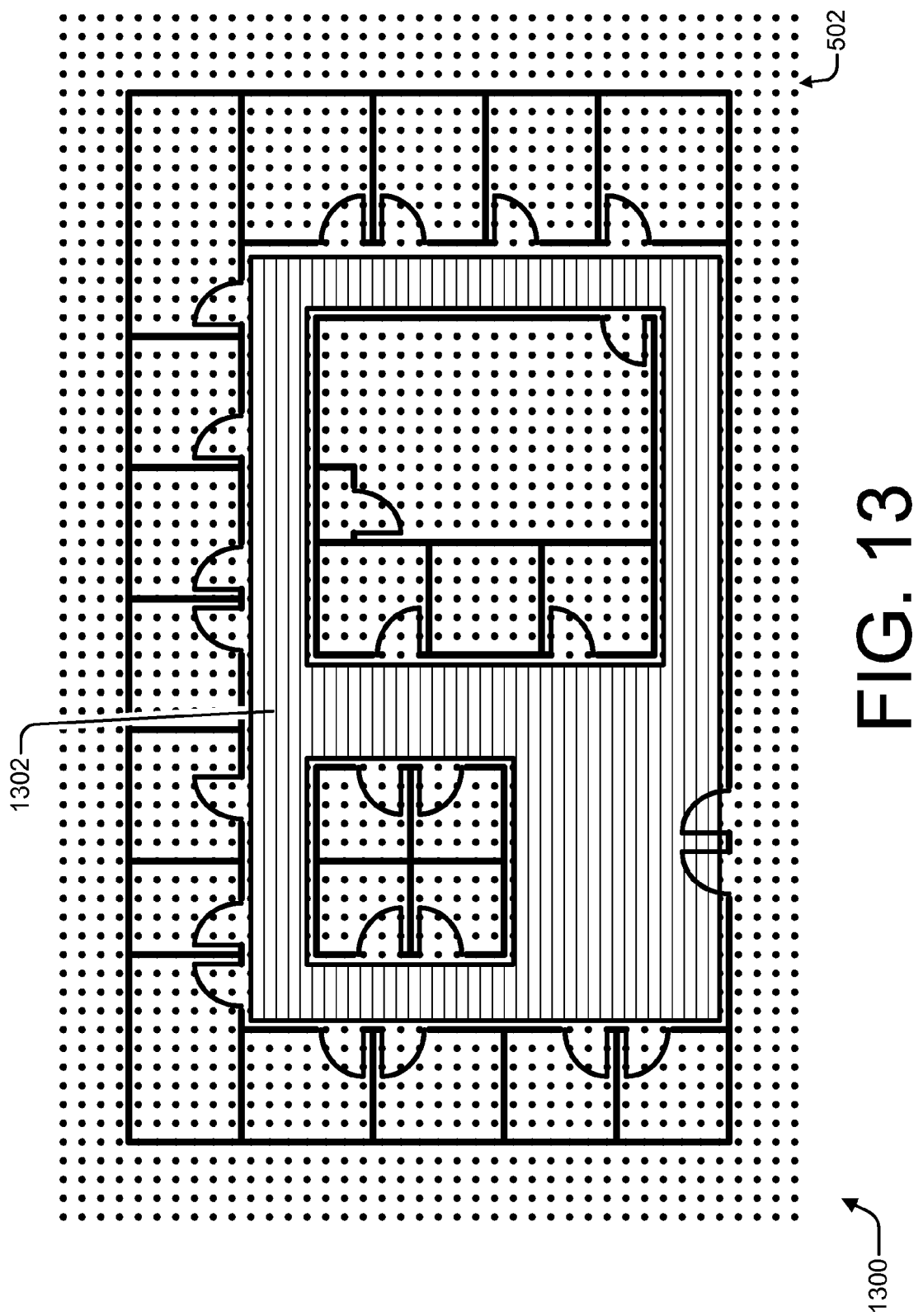
FIG. 13 is a schematic diagram of at least an example building portion in which autonomous area(s) may be detected as hallway(s) according to an implementation.

FIG. 13 is a schematic diagram 1300 of at least an example building portion in which autonomous area(s) may be detected as hallway(s) according to an implementation. Although autonomous areas may be determined while doors are modeled in a closed state, one or more hallways may be detected from determined autonomous areas while doors are modeled in a closed, open, or other state. For certain example implementations, from multiple autonomous areas, one or more hallways of a building structure may be detected based at least partly on a predetermined threshold of doors (e.g., interior doors) to which a given autonomous area is directly connected.

In FIG. 13, schematic diagram 1300 is comparable to building information 400 (of FIG. 4). Autonomous area 1302 may be detected to comprise one or more hallways because of a number of doors to which it is directly connected. In certain example implementations, an area (or a point) may be directly connected to another area, point, etc. if they may be interconnected via a traversable link. In an example as illustrated for schematic diagram 1300, autonomous area 1302 is directly connected to 22 of 23 interior doors. Thus, autonomous area 1302 is directly connected to 96% of the interior doors of the illustrated building structure.

By way of example, but not limitation, a predetermined threshold of interior doors may be an absolute value, a relative term, a combination thereof, and so forth, just to name a few examples. For instance, a threshold may be relative to a total number of doors in a building structure (or defined portion thereof, such as a floor, section, wing, etc.). Alternatively, a threshold may be relative to an average number of doors to which other autonomous areas are directly connected.

More specifically, to detect a building information or graph component that represents a hallway, autonomous area(s) that is (are) connected to an above average percentage of interior doors of a building structure may be found. For example, an implementation may define a hallway as an autonomous area that connects to at least 5%-25% (e.g., at least 10%) of the doors of or within a building structure, with a minimum of 4. For instance, if a building structure has 50 doors, then any autonomous area that is connected to 10+ doors (e.g., for a 20% threshold level) may be defined as a hallway.

Figure 14:
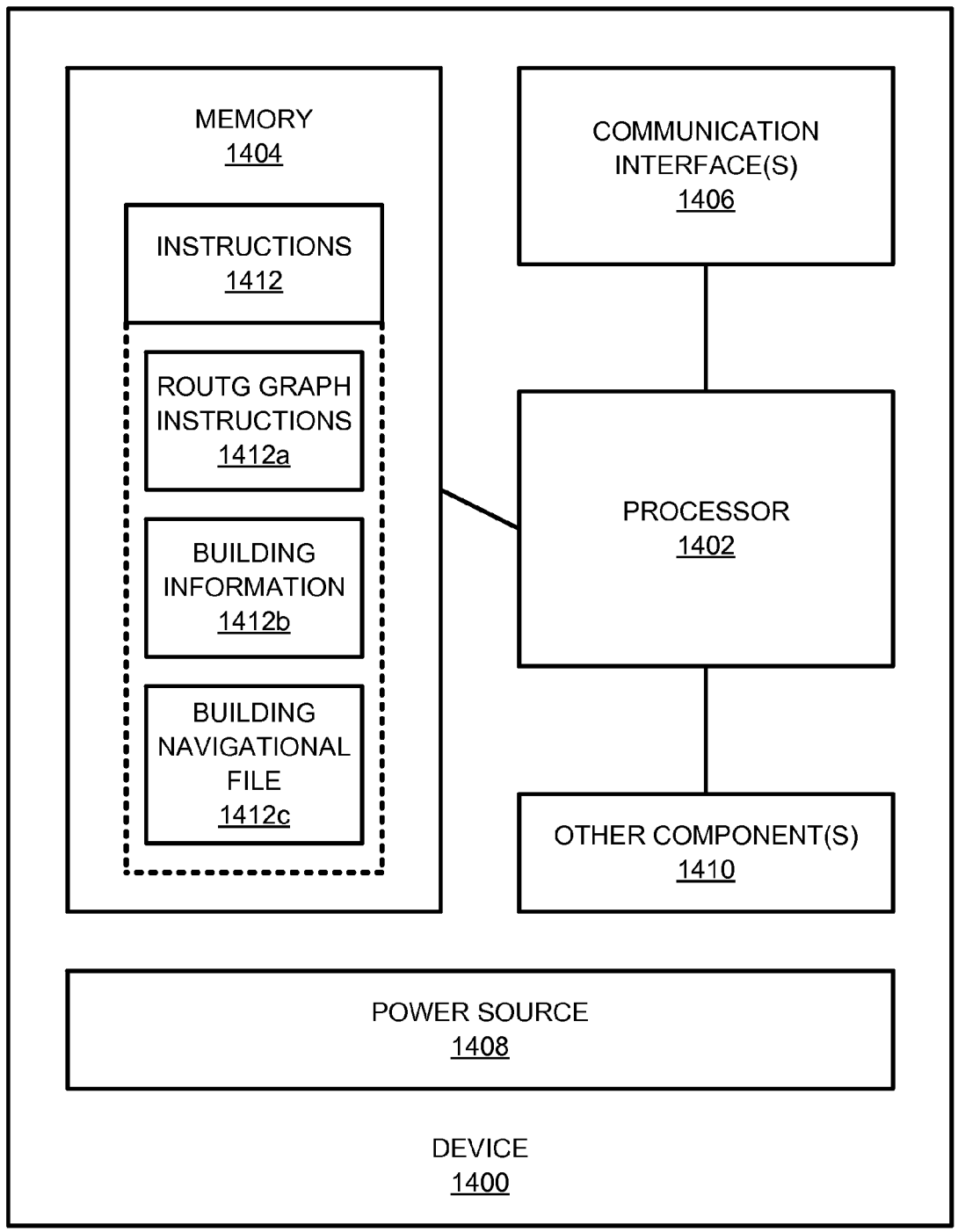
FIG. 14 is a schematic diagram illustrating an example device, according to an implementation, that may implement one or more aspects of routing graphs for buildings.

FIG. 14 is a schematic diagram illustrating an example device 1400, according to an implementation, that may implement one or more aspects of routing graphs for buildings. As illustrated, device 1400 may include at least one processor 1402, one or more memories 1404, at least one communication interface 1406, at least one power source 1408, and other component(s) 1410, such as an SPS unit (SPSU) (not explicitly shown). Memory 1404 is illustrated as including instructions 1412. However, a device 1400 may alternatively include more, fewer, and/or different components from those that are illustrated.

For certain example implementations, device 1400 may include and/or comprise an electronic device. Device 1400 may comprise, for example, any electronic device having at least one processor and/or memory. Examples for device 1400 include, but are not limited to, fixed processing devices (e.g., a desktop computer, one or more server computers, at least one telecommunications node, an intelligent router/switch, some combination thereof, etc.) and mobile processing devices (e.g., a notebook computer, a personal digital assistant (PDA), a netbook, a slate or tablet computer, a portable entertainment device, a mobile phone, a smart phone, a mobile station, some combination thereof, etc.), and so forth.

Power source 1408 may provide power to components and/or circuitry of device 1400. Power source 1408 may be a portable power source, such as a battery, or a fixed power source, such as an outlet in a car, house, or other building. Power source 1408 may also be a transportable power source, such as a solar or carbon-fuel-based generator. Power source 1408 may be integrated with or separate from device 1400.

Processor 1402 may comprise any one or more processing units. Memory 1404 may store, contain, or otherwise provide access to instructions 1412 (e.g., a program, an application, etc. or portion thereof; operational data structures; processor-executable instructions/code; some combination thereof; and so forth) that may be executable by processor 1402. Execution of such instructions 1412 by one or more processors 1402 may transform device 1400 into a special-purpose computing device, apparatus, platform, some combination thereof, and so forth.

Instructions 1412 may include routing graph instructions 1412a, building information 1412b, and/or building navigational file 1412c. Building information 1412b may correspond to, for example, building information 302 (of FIG. 3) (e.g., building information 400 (of FIG. 4)). Building navigational file 1412c may correspond to, for example, building navigational file 308 (of FIG. 3), which may include at least one routing graph 312, one or more connectivity graphs 316, and/or associated annotation information 314. Routing graph instructions 1412a may correspond to, for example, instructions that are capable of realizing one or more implementations of flow diagrams 600 and/or 700 (of FIGS. 6 and 7). Routing graph instructions 1412a may be executed to, for example, create at least a portion of building navigational file 1412c based at least partly on building information 1412b. Although not explicitly shown, instructions 1412 may also include instructions to provide one or more location-based services (LBS) using building navigational file 1412c.

In an example implementation, a fixed processing device, such as a server and/or telecommunications node, may execute routing graph instructions 1412a to create building navigational file 1412c based at least partly on building information 1412b. A same or a different fixed processing device may use building navigational file 1412c to provide a LBS to, e.g., a mobile device, which may include a SPSU. Alternatively, such a fixed processing device may provide a building navigational file 1412c to a mobile device to enable or otherwise further performance of some LBS. As still another alternative, a mobile device may include routing graph instructions 1412*a* to create a building navigational file 1412*c* from building information 1412*b* that has been downloaded (e.g., on demand). Other alternatives may instead be implemented without departing from claimed subject matter.

Communication interface(s) 1406 may provide one or more interfaces between device 1400 and other devices (e.g., and/or human operators). Hence, communication interface 1406 may include a screen (e.g., a touch screen), speaker, microphone, keyboard or keys, knobs/wheels, or other human-device input/output feature(s). Communication interface 1406 may include a transceiver (e.g., transmitter and/or receiver), a radio, an antenna, a wired interface connector or other such apparatus, some combination thereof, etc. to communicate wireless and/or wired signals (e.g., over wireless or wired communication links). Communication interface 1406 may also serve as a bus or other interconnect between and/or among other components of device 1400. Other component(s) 1410, if present, may comprise one or more other miscellaneous sensors, features, and so forth.

Methodologies described herein may be implemented by various means depending upon applications according to particular features and/or examples. For example, such methodologies may be implemented in hardware, firmware, software, discrete/fixed logic circuitry, any combination thereof, and so forth. In an implementation involving hardware, for example, a processor/processing unit may be implemented within one or more application specific integrated circuits (ASICs), digital signal processors (DSPs), digital signal processing devices (DSPDs), programmable logic devices (PLDs), field programmable gate arrays (FPGAs), processors generally, controllers, micro-controllers, microprocessors, electronic devices, other devices or units programmed to execute instructions and/or designed to perform the functions described herein, and/or combinations thereof, just to name a few examples. Herein, the term "control logic" may encompass logic implemented by software/firmware, hardware (e.g., discrete/fixed logic circuitry), any combination thereof, and so forth.

For an implementation involving firmware and/or software, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processing unit. Memory may be implemented within the processing unit or external to the processing unit. As used herein the term "memory" refers to any type of long term, short term, volatile, nonvolatile, or other memory and is not to be limited to any particular type of memory or number of memories, or type of media upon which memory is stored.

In an implementation involving firmware and/or software, the functions may be stored as one or more instructions or code on a computer-readable medium. Examples include computer-readable media encoded with a data structure and computer-readable media encoded with a computer program. Computer-readable medium may take the form of an article of manufacture. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processing units to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

Electronic devices may also operate in conjunction with Wi-Fi/WLAN or other wireless networks. For example, positioning data may be acquired via a Wi-Fi or other wireless network. In addition to Wi-Fi/WLAN signals, a wireless/mobile device may also receive signals from satellites, which may be from a Global Positioning System (GPS), Galileo, GLONASS, NAVSTAR, QZSS, a system that uses satellites from a combination of these systems, or any SPS developed in the future, each referred to generally herein as a Satellite Positioning System (SPS). Furthermore, implementations described herein may be used with positioning determination systems that utilize pseudolites or a combination of satellites and pseudolites. Pseudolites are usually ground-based transmitters that broadcast a Pseudo-Random Noise (PRN) code or other ranging code (e.g., similar to a GPS or CDMA cellular signal) that is modulated on an L-band (or other frequency) carrier signal, which may be synchronized with GPS time. Each such transmitter may be assigned a unique PN code so as to permit identification by a remote receiver. Pseudolites may be particularly useful in situations where SPS signals from an orbiting satellite might be unavailable, such as in tunnels, mines, buildings, urban canyons, or other enclosed areas. Another implementation of pseudolites is known as radio-beacons. The term "satellite", as used herein, is also to include pseudolites, equivalents of pseudolites, and similar and/or analogous technologies. The term "SPS signals", as used herein, is also to include SPS-like signals from pseudolites or equivalents of pseudolites. Certain implementations may also be applied to femtocells or a combination of systems that includes femtocells.

In an example implementation, a SPSU (when present) may be capable of determining a location of device 1400 using an SPS system or systems. Hence, example implementations that are described herein may be used with various SPSs. A SPS typically includes a system of transmitters positioned to enable entities to determine their location on or above the Earth based, at least in part, on signals received from the transmitters. Such a transmitter typically, but not necessarily, transmits a signal marked with a repeating pseudo-random noise (PN) code of a set number of chips and may be located on ground based control stations, user equipment, and/or space vehicles. In a particular example, such transmitters may be located on Earth orbiting satellite vehicles (SVs). For example, a SV in a constellation of Global Navigation Satellite System (GNSS) such as Global Positioning System (GPS), Galileo, Glonass or Compass may transmit a signal marked with a PN code that is distinguishable from PN codes transmitted by other SVs in the constellation (e.g., using different PN codes for each satellite as in GPS or using the same code on different frequencies as in Glonass). In accordance with certain aspects, the techniques presented herein are not restricted to global systems (e.g., GNSS) for SPS. For example, the techniques provided herein may be applied to or otherwise enabled for use in various regional systems, such as, e.g., Quasi-Zenith Satellite System (QZSS) over Japan, Indian Regional Navigational Satellite System (IRNSS) over India, Beidou over China, etc., and/or various augmentation systems (e.g., a Satellite Based Augmentation System (SBAS)) that may be associated with or otherwise enabled for use with one or more global and/or regional navigation satellite systems. By way of example but not limitation, an SBAS may include an augmentation system(s) that provides integrity information, differential corrections, etc., such as, e.g., Wide Area Augmentation System (WAAS), European Geostationary Navigation Overlay Service (EGNOS), Multi-functional Satellite Augmentation System (MSAS), GPS Aided Geo Augmented Navigation or GPS and Geo Augmented Navigation system (GAGAN), and/or the like. Thus, as used herein, an SPS may include any combination of one or more global and/or regional navigation satellite systems and/or augmentation systems, and SPS signals may include SPS, SPS-like, and/or other signals associated with such one or more SPS.

A mobile device/mobile station refers to a device such as a cellular or other wireless communication device, personal communication system (PCS) device, personal navigation device (PND), Personal Information Manager (PIM), Personal Digital Assistant (PDA), laptop, tablet or other suitable device which is capable of receiving wireless communication and/or navigation signals. Mobile device is also intended to include devices which communicate with a personal navigation device (PND), such as by short-range wireless, infrared, wireline connection, or other connection—regardless of whether satellite signal reception, assistance data reception, and/or position-related processing occurs at the device or at the PND. Also, mobile device is intended to include all devices, including wireless communication devices, computers, laptops, etc. which are capable of communication with a server, such as via the Internet, Wi-Fi, or other network, and regardless of whether satellite signal reception, assistance data reception, and/or position-related processing occurs at the device, at a server, or at another device associated with the network. Any operable combination of the above are also considered a mobile device.

Some portions of this Detailed Description are presented in terms of algorithms or symbolic representations of operations on binary digital signals that may be stored within a memory of a specific apparatus or special purpose computing device or platform. In the context of this particular Specification, the term specific apparatus or the like includes a general purpose computer once it is programmed to perform particular functions pursuant to instructions from program software/instructions. Algorithmic descriptions or symbolic representations are examples of techniques used by those of ordinary skill in the signal processing or related arts to convey the substance of their work to others skilled in the art. An algorithm here, and generally, may be considered to be a self-consistent sequence of operations or similar signal processing leading to a desired result. In this context, operations or processing involve physical manipulation of physical quantities. Typically, although not necessarily, such quantities may take the form of electrical and/or magnetic signals capable of being stored, transferred, combined, compared, transmitted, received, or otherwise manipulated.

It has proven convenient at times, principally for reasons of common usage, to refer to such signals as bits, data, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "identifying," "associating," "obtaining," "performing," "applying," "exploring," "analyzing," "creating," "modeling", "interconnecting," "overlaying," "detecting," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, and/or magnetic quantities within memories, registers, or other information storage devices, transmission devices, or display devices of the special purpose computer or similar special purpose electronic computing device.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concepts described herein. Therefore, it is intended that claimed subject matter not be limited to the particular examples disclosed, but that such claimed subject matter may also include all aspects falling within the scope of appended claims, and equivalents thereof.

What is claimed is:

1. A method being executed by a special purpose computing device comprising:
    receiving, by the special purpose computing device, building information descriptive of at least a portion of a building structure and of doors of the building structure;
    superimposing, by the special purpose computing device, a grid of points onto said building information, the grid of points comprising a set of points located at regular intervals in a plane;
    modeling the doors of the building structure in a closed state;
    determining a plurality of autonomous areas based on the superimposed grid of points wherein each autonomous area comprises a set of adjacent grid points interconnected by traversable links that is separated from any other autonomous area by non-traversable links; and
    interconnecting in the plane, by the special purpose computing device, at least a portion of a plurality of door node points with at least a portion of the plurality of autonomous areas to create at least one routing graph wherein the plurality of door node points correspond to the doors of the building structure and further wherein the at least one routing graph is a routing topology indicating a set of discrete traversable paths interconnecting the plurality of autonomous areas.

2. The method of claim 1, wherein said method further comprises:

interconnecting, by the special purpose computing device, at least a portion of adjacent points of said superimposed grid of points with traversable links.

3. The method of claim 2, wherein said traversable links comprise links that do not intersect said building structure of said building information.

4. The method of claim 3, wherein points of said superimposed grid of points comprise nodes of said at least one routing graph, and said traversable links comprise edges of said at least one routing graph.

5. The method of claim 1, wherein said method further comprises:
provide to a mobile device navigational information relating to said building structure using said at least one routing graph.

6. The method of claim 1 wherein an interval distance between adjacent points of the superimposed grid of points varies within the superimposed grid of points.

7. The method of claim 1 wherein the building information comprises a computer-aided design (CAD) format file converted to an open format file wherein the open format file is parsable using text parsing utilities.

8. The method of claim 1 further comprising:
determining the plurality of autonomous areas based on one or more walls of the building structure, wherein the building information includes wall information for the one or more walls and further wherein the one or more walls include exterior walls and interior walls; and
determining that a given autonomous area of the plurality of autonomous areas is one or more hallways based on the given autonomous area being connected to at least a threshold number of the doors of the building structure.

9. The method of claim 1 wherein the building information is organized into at least two layers wherein first information in a first layer is parsed to extract the building structure and wherein second information in a second layer is parsed to extract one or more annotations associated with the building structure.

10. The method of claim 1 wherein the building information includes one or more annotations and further comprising linking the one or more annotations to the at least one routing graph.

11. A special purpose computing device comprising:
at least one memory to store instructions; and
one or more processors to execute said instructions to:
receive building information descriptive of at least a portion of a building structure and of doors of the building structure,
superimpose a grid of points onto said building information, the grid of points comprising a set of points located at regular intervals in a plane;
model the doors of the building structure in a closed state;
determine a plurality of autonomous areas based on the superimposed grid of points wherein each autonomous area comprises a set of adjacent grid points interconnected by traversable links that is separated from any other autonomous area by non-traversable links; and
interconnect in the plane at least a portion of a plurality of door node points with at least a portion of the plurality of autonomous areas to create at least one routing graph wherein the plurality of door node points correspond to the doors of the building structure and further wherein the at least one routing graph is a routing topology indicating a set of discrete traversable paths interconnecting the plurality of autonomous areas.

12. The device of claim 11, wherein said one or more processors are further to execute said instructions to:
interconnect at least a portion of adjacent points of said superimposed grid of points with traversable links.

13. The device of claim 12, wherein said traversable links comprise links that do not intersect said building structure of said building information.

14. The device of claim 12, wherein points of said superimposed grid of points comprise nodes of said at least one routing graph, and said traversable links comprise edges of said at least one routing graph.

15. The device of claim 11, wherein said one or more processors are further to execute said instructions to:
provide to a mobile device navigational information relating to said building structure using said at least one routing graph.

16. An article comprising: at least one non-transitory storage medium having stored thereon instructions executable by one or more processors to:
receive building information descriptive of at least a portion of a building structure and of doors of the building structure,
superimpose a grid of points onto said building structure information, the grid of points comprising a set of points located at regular intervals in a plane;
model the doors of the building structure in a closed state;
determine a plurality of autonomous areas based on the superimposed grid of points wherein each autonomous area comprises a set of adjacent grid points interconnected by traversable links that is separated from any other autonomous area by non-traversable links; and
interconnect in the plane at least a portion of a plurality of door node points with at least a portion of the plurality of autonomous areas to create at least one routing graph based at least in part on said superimposed grid of points wherein the plurality of door node points correspond to the doors of the building structure and further wherein the at least one routing graph is a routing topology indicating a set of discrete traversable paths interconnecting the plurality of autonomous areas.

17. The article of claim 16, wherein said at least one non-transitory storage medium has stored thereon further instructions executable by one or more processors to:
interconnect at least a portion of adjacent points of said superimposed grid of points with traversable links.

18. The article of claim 17, wherein said traversable links comprise links that do not intersect said building structure of said building information.

19. The article of claim 17, wherein points of said superimposed grid of points comprise nodes of said at least one routing graph, and said traversable links comprise edges of said at least one routing graph.

20. The article of claim 16, wherein said at least one non-transitory storage medium has stored thereon further instructions executable by the one or more processors to:
provide to a mobile device navigational information relating to said building structure using said at least one routing graph.

21. An apparatus comprising:
means for receiving building information descriptive of at least a portion of a building structure and of doors of the building structure,
means for superimposing a grid of points onto said building information, the grid of points comprising a set of points located at regular intervals in a plane;
means for modeling the doors of the building structure in a closed state;
means for determining a plurality of autonomous areas based on the superimposed grid of points wherein each autonomous area comprises a set of adjacent grid points interconnected by traversable links that is separated from any other autonomous area by non-traversable links; and means for interconnecting in the plane at least a portion of a plurality of door node points with at least a portion of the plurality of autonomous areas to create at least one routing graph wherein the plurality of door node points correspond to the doors of the building structure and further wherein the at least one routing graph is a routing topology indicating a set of discrete traversable paths interconnecting the plurality of autonomous areas.

22. The apparatus of claim 21, further comprising:

means for interconnecting at least a portion of adjacent points of said superimposed grid of points with traversable links.

23. The apparatus of claim 22, wherein said traversable links comprise links that do not intersect said building structure of said building information.

24. The apparatus of claim 23, wherein points of said superimposed grid of points comprise nodes of said at least one routing graph, and said traversable links comprise edges of said at least one routing graph.

25. The apparatus of claim 21, further comprising:

means for providing to a mobile device navigational information relating to said building structure using said at least one routing graph.

* * * * *